United States Patent
Martin et al.

(10) Patent No.: US 6,297,579 B1
(45) Date of Patent: Oct. 2, 2001

(54) ELECTRON GUN CONTROLLED SMART STRUCTURE

(75) Inventors: Jeffrey W. Martin, Albuquerque, NM (US); John Alan Main, Lexington, KY (US); James M. Redmond; Tammy D. Henson, both of Albuquerque, NM (US); Robert D. Watson, Tijeras, NM (US)

(73) Assignee: Sandia National Laboratories, Albuquerque, NM (US)

( * ) Notice: Subject to any disclaimer, the term of this patent is extended or adjusted under 35 U.S.C. 154(b) by 54 days.

(21) Appl. No.: 09/712,482

(22) Filed: Nov. 13, 2000

(51) Int. Cl.$^7$ .................................................... H01L 41/04

(52) U.S. Cl. .............................................. 310/330; 310/800

(58) Field of Search ...................................... 310/328, 330, 310/331, 332, 800

(56) References Cited

U.S. PATENT DOCUMENTS

| | | | |
|---|---|---|---|
| 3,899,709 | 8/1975 | Brown et al. | 313/369 |
| 3,904,274 | 9/1975 | Feinleib et al. | 350/161 |
| 4,280,756 | 7/1981 | Albertinetti | 350/360 |
| 4,868,447 | 9/1989 | Lee et al. | 310/328 |
| 5,026,977 | * 6/1991 | Hubbard, Jr. | 250/201.9 |
| 5,159,498 | 10/1992 | Hubbard, Jr. | 359/847 |
| 6,188,160 | * 2/2001 | Main et al. | 310/314 |

OTHER PUBLICATIONS

Takuso Sato, Hiroyuki Ishida, and Osamu Ikeda, *Adaptive PVDF piezoelectric deformable mirror system*, Applied Optics, vol. 19, No. 9, May 1, 1980 pp. 1430–1434.

* cited by examiner

Primary Examiner—Nestor Ramirez
Assistant Examiner—Peter Medley

(57) ABSTRACT

Disclosed is a method and system for actively controlling the shape of a sheet of electroactive material; the system comprising: one or more electrodes attached to the frontside of the electroactive sheet; a charged particle generator, disposed so as to direct a beam of charged particles (e.g. electrons) onto the electrode; a conductive substrate attached to the backside of the sheet; and a power supply electrically connected to the conductive substrate; whereby the sheet changes its shape in response to an electric field created across the sheet by an accumulation of electric charge within the electrode(s), relative to a potential applied to the conductive substrate. Use of multiple electrodes distributed across on the frontside ensures a uniform distribution of the charge with a single point of e-beam incidence, thereby greatly simplifying the beam scanning algorithm and raster control electronics, and reducing the problems associated with "blooming". By placing a distribution of electrodes over the front surface of a piezoelectric film (or other electroactive material), this arrangement enables improved control over the distribution of surface electric charges (e.g. electrons) by creating uniform (and possibly different) charge distributions within each individual electrode. Removal or deposition of net electric charge can be affected by controlling the secondary electron yield through manipulation of the backside electric potential with the power supply. The system can be used for actively controlling the shape of space-based deployable optics, such as adaptive mirrors and inflatable antennae.

35 Claims, 18 Drawing Sheets

BIMORPH™ Bender Geometry, with Parallel Wiring

BIMORPH™ Bender Geometry, with Series Wiring

*(Prior Art)*

ELECTRON GUN CONTROLLED SMART STRUCTURE

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

The present invention relates generally to adaptive (e.g. "smart") structures, and more specifically to a system and method for controlling the shape of a sheet of electroactive material, such as laminated piezoelectric films, by using an electron beam gun to deposit charge on multiple electrodes attached to the frontside of the sheet.

Electroactive materials, including piezoelectric, magneto restrictive, and electroristrictive, are used in "smart" structures because they provide direct coupling between electrical energy and mechanical energy in real-time. Piezoelectricity was discovered by Pierre and Jacques Curie in the 1880's. Piezoelectric properties occur naturally in some crystalline materials (e.g. Rochelle salt), and can be induced in others by applying a "poling" process (e.g. in lead zirconate titanate (PZT) and in polyvinylidene fluoride, PVDF). The orientation of the DC poling field determines the orientation of the mechanical and electrical axes. After the poling process is complete, a voltage lower than the poling voltage changes the dimension s of a ceramic element as long as the voltage is applied. A voltage with the same polarity as the poling voltage causes additional expansion along the poling axis and contraction perpendicular to the poling axis. A voltage with the opposite polarity has the opposite effect: contraction along the poling axis, and expansion perpendicular to the poling axis. In both cases, the ceramic element returns to its poled dimensions when the voltage is removed from the electrodes.

Application of a mechanical stress to a piezoelectric material generates an electric field; conversely, application of an electric field generates a mechanical strain (e.g. expansion and/or contraction). This induced strain can be used to change the position or shape of a structure, and to apply forces, in real-time. Active control of a "smart" structure's position, correction of improper shape, and suppression of undesirable vibrations can, therefore, be realized by applying an electrical potential to actuators made of electroactive materials. The actuators can be discrete or continuous; embedded or attached to the surface. For example, actuators made of piezoelectric materials are used in ink-jet printers, loudspeakers, sonar transducers, optical stages, adaptive mirrors, and spark generators. Piezoelectric sensors include accelerometers, microphones, and sonar systems.

As shown in FIGS. 1–3, conventional UNIMORPH or BIMORPH (registered trade names of Morgan Matroc, Inc., Electro Ceramics Division, Bedford, Ohio) piezoelectric structures will bend in response to an applied electric field and can, therefore, be actively deformed into desirable shapes. UNIMORPH structures (see FIG. 1) bend when a single expander plate of piezoelectric material expands or contracts relative to the attached substrate (due to the offset neutral axis). Parallel BIMORPH structures have two expander plates polarized in the same direction (see FIG. 2). Series BIMORPH structures have two plates polarized in opposite directions (see FIG. 3). BIMORPH elements develop relatively large deflections compared to UNIMORPH structures. A parallel-type BIMORPH develops twice the deflection, for the same applied voltage, than the series-type BIMORPH, because the electric field across any individual layer is twice as high in the parallel-type design, than in the series-type design. Consequently, parallel BIMORPHS are preferred for piezoelectric actuators, and series BIMORPHS for piezoelectric sensors. Electrodes are applied to the piezoelectric layers, and conventionally have attached electrical leads. For uniaxial actuation, multiple layers of piezoelectric materials can be stacked together and laminated, so that they are mechanically connected in series and electrically connected in parallel. The displacement of the whole stack assembly is equal to the sum of the individual displacements.

An important example of "smart" structures is adaptive mirrors. These can be used by astronomers to correct for turbulence of the atmosphere, and for wavefront control of laser beams in optical systems for military applications. Additionally, space-based deployable optics are needed to satisfy the need for enhanced capabilities for remote sensing. In particular, the need arises for low cost surveillance satellites that can be quickly launched and positioned in orbit to monitor rapidly evolving events almost anywhere on the globe. However, the desire for low cost and flexibility is in opposition with the requirement for large apertures needed to ensure sufficient ground resolution and sensitivity. Such systems usually imply large, expensive launch vehicles to accommodate the size of the primary mirror. Development of a deployable mirror or antenna is one approach being considered to satisfy these conflicting requirements. Folded up and carried on a small booster, the deployable mirror or antenna would open to its full diameter after reaching orbit. Unfortunately, the inherent flexibility of such a device makes it difficult to achieve optical quality surfaces, and this approach has therefore not yet been proven feasible. A need exists, therefore, for a system and method for actively controlling the shape of space-deployable mirrors to obtain optical quality surfaces.

Fueled by both NASA and DoD interests, much of the on-going research in deployable optics is focused on precision assembly of rigid mirror segments. While this approach shows promise for achieving near term sensing goals, it is unlikely that such a technique is capable of achieving long term areal density goals (on the order of 1 $kg/m^2$) needed to meet cost targets. Low areal densities can be achieved by using inflatable optics. However, this approach allows only limited shape correction by adjusting internal pressure, and suffers from the added complication of diffraction from passing light rays through a gaseous medium.

Traditionally, the shape of adaptive mirrors have been controlled by using 10s –100's of individual piezoelectric stacks, or UNIMORPH and BIMORPH piezoelectric bending actuators, each having their own electrical lead wire and individual power supply. However, for highly flexible, large structures requiring precision shape control, the number of individual actuators needed makes individual lead wires and dedicated power supplies impractical. This limitation has led investigators to consider crafting the entire mirror structure from electroactive materials, such as large sheets of laminated piezoelectric films, which have only one electrode on the backside connected to a wire. In this concept, excitation voltage is applied to the frontside by direct deposition of electrons emitted by an electron beam gun. Operated in a vacuum, the scanned electron gun eliminates the need for using attached lead wires, and replaces the individual power supplies with a single energy input device. With this technique, the electric charge is controlled by steering the electron beam to a specific location on the mirror, and by controlling the dwell time and refresh rate. Specific electron beam characteristics, such as beam diameter, beam energy, and beam current, can be individually controlled to optimize the performance.

Since the current loop is only closed at the point of electron beam incidence on the piezoelectric material, distributed shape correction can be achieved by scanning the gun across the bare surface of the piezoelectric film and then dwelling on the desired location (e.g. addressing), and possibly rastering the beam in a defined region about the desired location. Only a single backside electrode is needed to control the electric charge, and to close the current loop. In addition, secondary electron yield characteristics of the piezoelectric material enable either the addition or removal of charge from the surface by altering the electric potential of the single backside electrode. Since the electron gun can only be operated efficiently in vacuum environments, it is well suited for active control of deployable optics in space. The spatial resolution can be as small as the spot size of the electron beam, which can be as small as tens of microns.

U.S. Pat. No. 5,159,498, "Active Mirror Assembly", to Hubbard, discloses the use of an electron beam gun for depositing charge on the rear surface of a piezoelectrically active pellicle made of a pair of oppositely-poled bare PVDF films, with a conductive front mirror surface. Hubbard teaches changing the electron energy in real-time to actively control the PVDF film's shape by taking advantage of the dependence of secondary electron emission yield on incident electron energy. However, Hubbard's control process is inherently unstable in many regions of operation. Additionally, Hubbard does not teach the use of multiple electrodes attached to the frontside of the PVDF film to collect and uniformly distribute the electron charges deposited by the electron beam gun, which problems associated with "blooming" (see below).

The use of an electron beam gun to apply distributed electric charges to bare PVDF films is discussed in "Control of Distributed Actuators Without Electrodes", by J. A. Main, in Proc. of 1997 ASME International Engineering Congress and Exposition, November 14–19, Dallas, Tex., AD-Vol. 54, Adaptive Structures and Material Systems. Main discusses the use of a cross-ply 0/90 composite geometry of PVDF films having preferentially biased piezoelectric properties. However, Main teaches that permanent surface (e.g. frontside) electrodes are not required because the need for electrodes is "eliminated completely" when using e-gun control.

Unfortunately, a critical problem with depositing electrons directly on to a bare piezoelectric film is the unwanted spreading of electric charges (e.g. electrons), which form an amorphous cloud of electrons in the vicinity of the electron beam incident spot or rastered area. This "blooming" effect continuously increases the cloud's diameter until the electron current is stopped. Uncontrolled blooming can degrade the degree of control required for precision adaptive optics.

Against this background, the present invention was developed, which relates to a method and system for actively controlling the shape of a sheet of electroactive material, comprising one or more electrodes attached to the frontside of the sheet; and including means for generating, aiming, and depositing a beam of charged particles (e.g. electrons) onto the electrode(s), whereby the sheet changes its shape in response to an electric field created across the sheet by an accumulation of electric charge within the electrode(s). Use of an electrode on the frontside ensures a uniform distribution of the charge with a single point of e-beam incidence, thereby greatly simplifying the beam scanning algorithm and raster control electronics, and also reducing the problems caused by "blooming". By placing a distribution of multiple electrodes over the front surface of the piezoelectric film (or other electroactive material), this arrangement enables improved control over the distribution of surface electric charges (e.g. electrons) by creating uniform (and possibly different) charge distributions within each individual electrode. Removal or deposition of net electric charge can be affected by controlling the secondary electron yield through manipulation of the backside electric potential.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

SUMMARY OF THE INVENTION

The present invention relates to a method and system for actively controlling the shape of a sheet of electroactive material; the system comprising one or more electrodes attached to the frontside of the electroactive sheet; a charged particle generator, disposed so as to direct a beam of charged particles (e.g. electrons) onto at least one of the electrodes; a conductive substrate attached to the backside of the sheet; and a power supply electrically connected to the conductive substrate to control the backside electric potential. The electroactive (e.g. piezoelectric, electrorestrictive, or magnetorestrictive) sheet, which can be attached to a flexible structure or membrane, changes its shape in response to a transverse electric field created across the sheet by an accumulation of electric charge within the electrode(s) located on the frontside, relative to a potential applied to the conductive substrate. Use of an electrode attached on the frontside ensures a uniform distribution of the charge with a single point of e-beam incidence, thereby greatly simplifying the beam scanning algorithm and raster control electronics, and reducing problems associated with "blooming".

By placing a distribution of multiple electrodes over the front surface of the electroactive sheet, this arrangement enables improved control over the distribution of surface electric charges (e.g. electrons) by creating uniform charge distributions within each individual electrode. Complex shape corrections can, therefore, be realized by aiming and addressing the electron beam source (e.g. e-gun) to sequentially irradiate an array of selected electrodes, thereby depositing a two-dimensional (e.g. X-Y) spatial distribution of electric charge within the distributed multiple electrodes. Simultaneous manipulation of the backside electric potential (by operation of the power supply) controls the potential drop (e.g. difference) across the electroactive material, which proportionally induces a net mechanical strain at the location of the irradiated electrode, thereby changing the shape of the sheet. Removal or deposition of net electric charge can also be affected by controlling the secondary electron emission through manipulation of the backside electric potential. The system is ideally suited for actively controlling the shape of space-based deployable optics, such as adaptive mirrors and inflatable antennae.

DETAILED DESCRIPTION OF THE INVENTION

Figure 1:
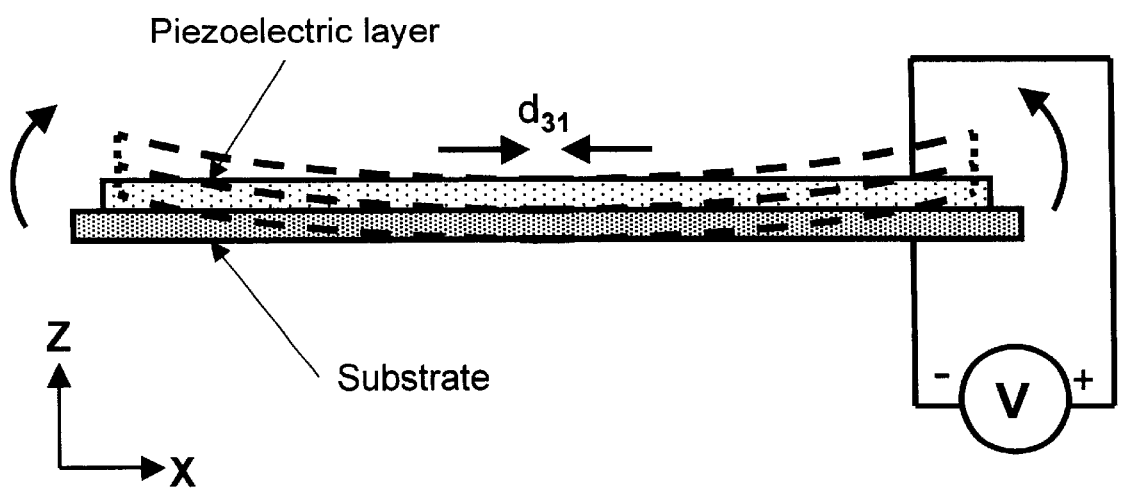
FIG. 1 (prior art) illustrates a schematic cross-section side view of a conventional UNIMORPH piezoelectric bender geometry.
Figure 2:
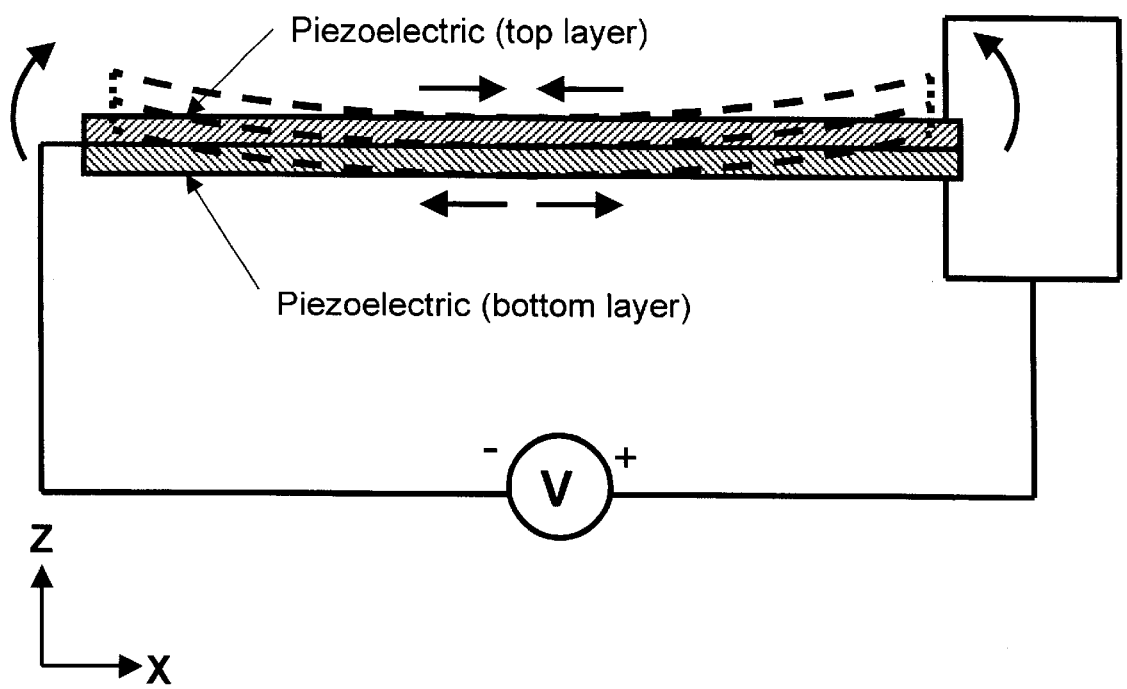
FIG. 2 (prior art) illustrates a schematic cross-section side view of a conventional BIMORPH piezoelectric bender geometry, with parallel wiring, and poles oriented in the same direction.
Figure 3:
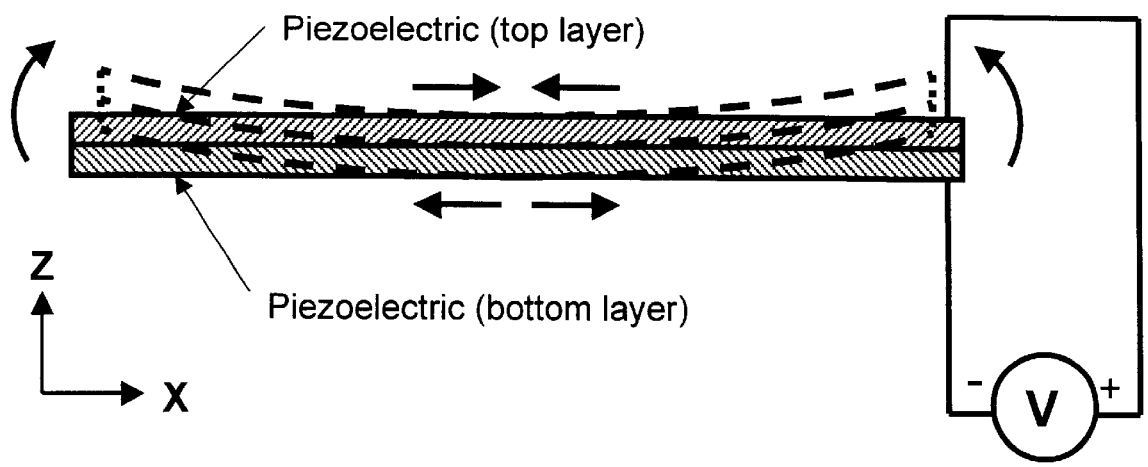
FIG. 3 (prior art) illustrates a schematic cross-section side view of a conventional BIMORPH piezoelectric bender geometry, with series wiring, and poles oriented in the opposite direction.

FIGS. 1–3 illustrate prior art UNIMORPH and BIMORPH piezoelectric bending structures used in conventional piezoelectric actuators and sensors. In this application, the use of the phrase "a sheet of electroactive material" is defined to include, among other things, conventional UNIMORPH and BIMORPH piezoelectric bending structures of the type illustrated in FIGS. 1–3.

System for Shape Control

Figure 4:
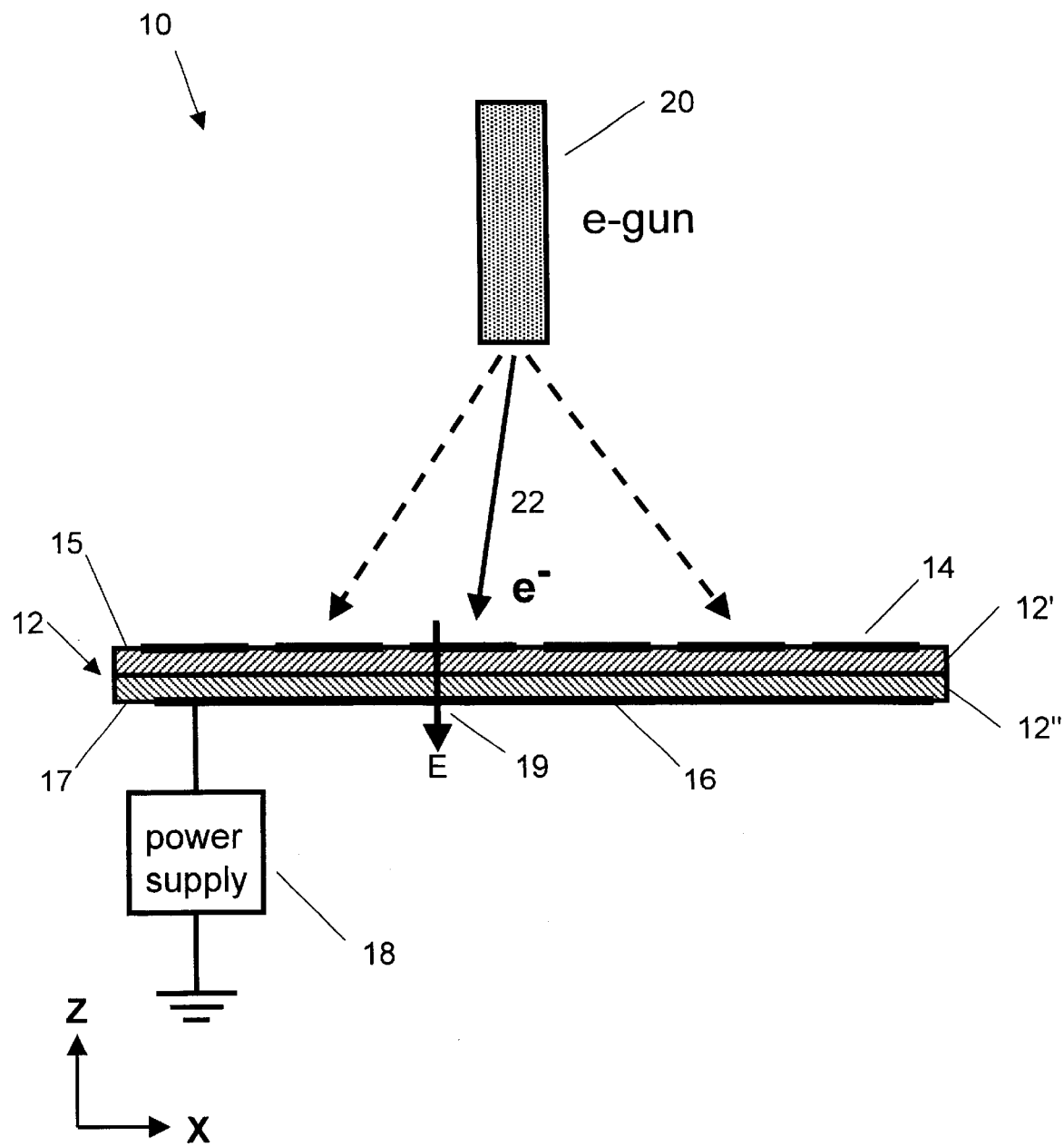
FIG. 4 illustrates a schematic side view of a first example of a system for actively controlling the shape of a sheet, according to the present invention.

FIG. 4 illustrates a schematic side view of a first example of a system for actively controlling the shape of a sheet, according to the present invention. Active control system 10 comprises a piezoelectric BIMORPH sheet 12; a plurality of electrodes 14 distributed across the frontside 15 of sheet 12; a conductive substrate 16 attached to the backside 17 of sheet 12; a power supply 18 electrically connected to conductive substrate 16; and an electron beam gun 20, disposed so as to direct a beam of electrons 22 onto selected electrodes 14. Electron beam gun 20 can include deflection/focussing plates or magnetic coils (not shown) for deflecting, aiming, and focussing the beam of electrons 22 towards any selected electrode 14 or group of electrodes 14. The gross accumulation of negative electric charge from deposition of electrons 22 on electrode 14 depends on the e-beam current, energy, spot size (e.g. diameter) and dwell time. The net accumulation of charge depends also on the rate of secondary electron emission from the surface, which depends primarily on the secondary electron emission yield curve for the specific electrode material, and on the electron's energy at impact. For PVDF, the maximum secondary electron yield is 2.5, occurring at an energy of 250 eV. At above 1500 eV the secondary yield drops below 1.0 again. In operation, the net secondary electron yield can also be controlled by adjusting the electric potential of conductive substrate 16 through operation of power supply 18.

The net accumulation of electric charge within electrode 14 (e.g. voltage), combined with any bound electric dipole charges internal to the electroactive material, creates a net transverse electric field 19 that passes through sheet 12. Piezoelectric BIMORPH sheet 12 bends in response to this transverse electric field 19. The degree of bending (e.g. amount of curvature) in sheet 12 increases with increases in electric field 19, although non-linear effects may occur at higher fields due to saturation or depolarization effects. The magnitude of electric field 19 depends on both the backside electric potential of conductive substrate 16, and the net accumulation of charge (e.g. voltage) within electrode 14. Specific, individual electrodes 14 can be charged to different voltages by aiming (e.g. addressing) electron beam 22 to deposit electrons on the selected electrode 14, and by controlling the dwell time (e.g. deposition time) appropriately. During the period of e-beam irradiation of selected electrode 14, the power amplifier 18 can be adjusted to supply a predetermined voltage to conductive substrate 16. The combination of an appropriately-selected voltage applied to the backside conductive substrate 16, with the simultaneous irradiation of selected frontside electrode 14 by electrons 22, produces the desired magnitude of the transverse electric field 19 across sheet 12 at the location underlying electrode 14. Mechanical strain induced in sheet 12 by the applied transverse electric field 19 at the location underneath electrode 14 results in local changes in the shape of sheet 12.

Electrodes 14 and conductive substrate 16 can be made of well-known conductive materials, e.g. nickel, silver, gold, copper, nickel-copper alloy, or aluminum with high electrical conductivity. An essentially uniform distribution of electric charge develops inside of electrode 14 due to the electrode's high conductivity. Electrodes 14 and conductive substrate 16 can be fabricated by thin-film or thick-film deposition processes well known in the semiconductor industry, electroplating, or by painting conductive paint by hand. No wires are needed to be connected to frontside electrodes 14, because the lead wires typically used in conventional electrodes have been removed in the present invention and replaced by the directly deposited beam of charged particles (e.g. electrons) 22.

Referring still to FIG. 4, sheet 12 is illustrated as a BIMORPH piezoelectric bending structure with series wiring. In this first example, sheet 12 comprises two layers 12' and 12" of conventional PZT piezoelectric ceramic (lead zirconate titanate), laminated together with their Z-axis polarization (e.g. "poles") arranged so that layer 12' has its poling direction aligned in the direction opposite to the poling axis of the adjacent layer 12" (i.e. in the standard series geometry). Creation of the transverse electric field 19 across sheet 12 by deposition of electron beam 22 causes layer 12' to expand while layer 12" contracts (or visa-versa), causing sheet 12 to bend, like a bi-metallic thermostat strip having two different thermal expansion coefficients.

Electron beam gun 20 can generate, aim, and focus a tight beam of electrons, with a spot size as small as 10 microns, or smaller. Alternatively, other charged particles can be used for the purpose of depositing electric charges on electrode(s) 14. Charged ions can be used by stripping electrons off and then accelerating the positively charged ions in an ion beam generator, such as a Van de Graff generator. Positively charged particles can include protons, helium ions, argon ions, etc. Doubly charged helium ions (e.g. alpha particles), can also be generated by natural radioactive decay of well-known isotopes (e.g. polonium 210). Alternatively, radioactive decay can produce negatively or positively charged beta particles (e.g. electrons or positrons). In a vacuum environment, the range of alpha and beta particles is sufficiently long to travel the required distance from charged particle source 20 to electrode 14. Either electric or magnetic fields (or both) can be used to deflect, aim, and focus a beam 22 of these charged particles.

Electron beam gun 20 can be a commercially available model, EFG-7, made by Kimbal Physics, Inc. This apparatus and accompanying amplifier provide the capability to project a tightly focused electron beam with beam energy adjustable between 0 and 1500 eV. Beam current can be adjusted from 0 to 100 micro-Amps. Focus control is provided to maintain a tight beam spot at a variety of energy levels, and the beam may be deflected and aimed over approximately an 8 cm×8 cm area at a gun to target range of 15 cm. All beam parameters, energy, current, focus, X- and Y- deflection may be manipulated manually or through direct input from an external controller. Power supply 18 can be a power amplifier with the capability to control the backside potential, for example, from −200 V to +200 V.

Figure 5:
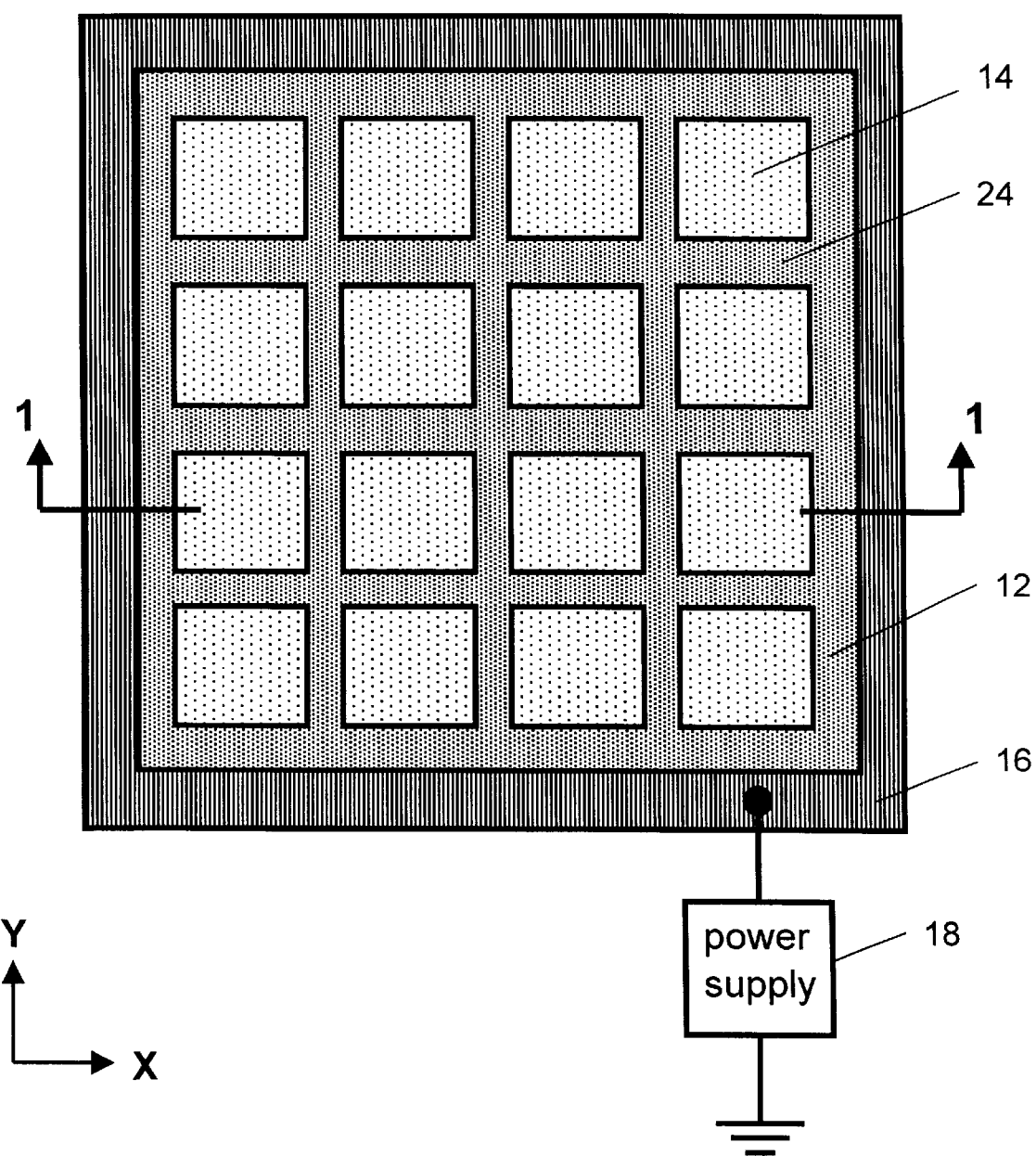
FIG. 5 illustrates a schematic top view of a second example of a system for actively controlling the shape of a sheet, according to the present invention.

FIG. 5 illustrates a schematic top view of a second example of a system for actively controlling the shape of a sheet, according to the present invention. In this view, a plurality of square-shaped electrodes 14 are arranged in a uniform, close-packed pattern across, and attached to, the surface of electroactive sheet 12. A gap 24 exists in-between adjacent electrodes 14 to allow for the independent buildup of different voltages on individual electrodes across the surface of sheet 12, which is controlled by operation of the charged particle generator (not shown). The precision and degree of control of the resultant curvature of sheet 12 can be improved by using a larger number of smaller-sized electrodes 14; limited by the resolution of the e-beam's spot size (e.g. 10 microns) and the accuracy of aiming control provided by the beam's deflection system.

Figure 6:
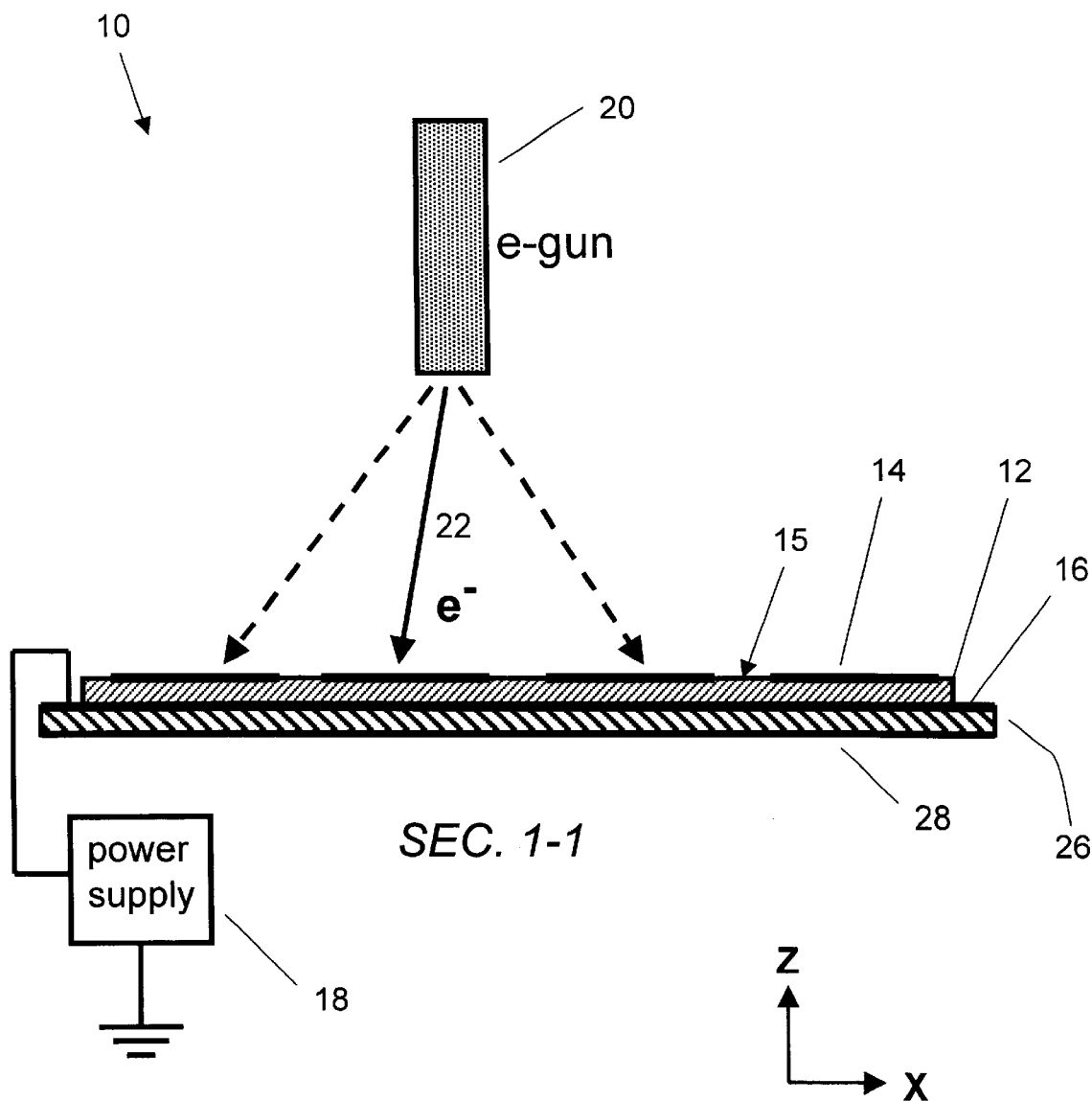
FIG. 6 illustrates a schematic cross-section view (SEC. 1—1) of the second example shown in FIG. 5, of a system for actively controlling the shape of a sheet, according to the present invention.

FIG. 6 illustrates a schematic cross-section view (SEC. 1—1) of the second example shown in FIG. 5, of a system for actively controlling the shape of a sheet, according to the present invention. Active control system 10 comprises a piezoelectric UNIMORPH sheet 12 (see FIG. 1) attached to a substrate 26; a plurality of electrodes 14 distributed across the frontside 15 of sheet 12; a conductive substrate 16 disposed in-between of sheet 12 and substrate 26; a power supply 18 electrically connected to conductive substrate 16; and an electron beam gun 20, disposed so as to direct a beam of electrons 22 onto selected electrodes 14. Substrate 26 can have a reflective surface 28 disposed on the backside. Reflective surface 28 can be a thin metallic film, such as a sputtered coating of gold. Structure 26 can be a thin polymeric or metallic flexible membrane, suitable for use as an inflatable, deployable mirror or antenna structure.

Figure 7:
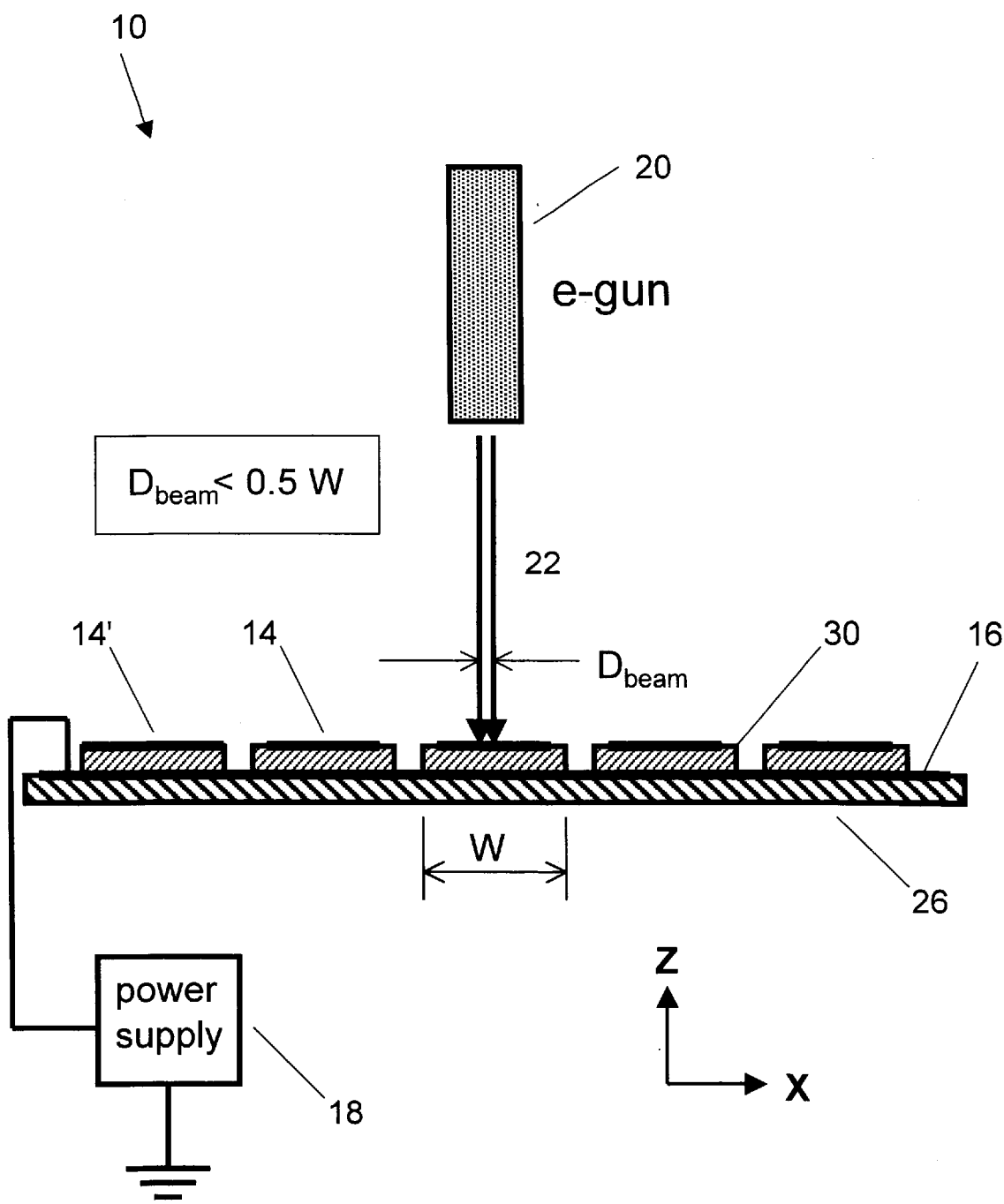
FIG. 7 illustrates a schematic cross-section side view of a third example of a system for actively controlling the shape of a sheet, according to the present invention.

FIG. 7 illustrates a schematic cross-section side view of a third example of a system for actively controlling the shape of a sheet, according to the present invention. Active control system 10 comprises a plurality of piezoelectric UNIMORPH patches 30 attached to a substrate 26 and disposed in a regular, close-packed square or hexagonal array; a plurality of electrodes 14 attached to the frontside of each piezoelectric patch 30; a conductive substrate 16 disposed in-between of the backside of patches 30 and substrate 26; a power supply 18 electrically connected to conductive substrate 16; and an electron beam gun 20, disposed so as to direct a beam of electrons 22 onto selected electrodes 14. In this third example, electron beam 22 can have a diameter that is less than 50% of the lateral dimensions "W" of patch 30. Electrode 14 can extend across a majority of the frontside surface area of patch 30, or can extend completely across the surface, as illustrated with electrode 14'.

Figure 8:
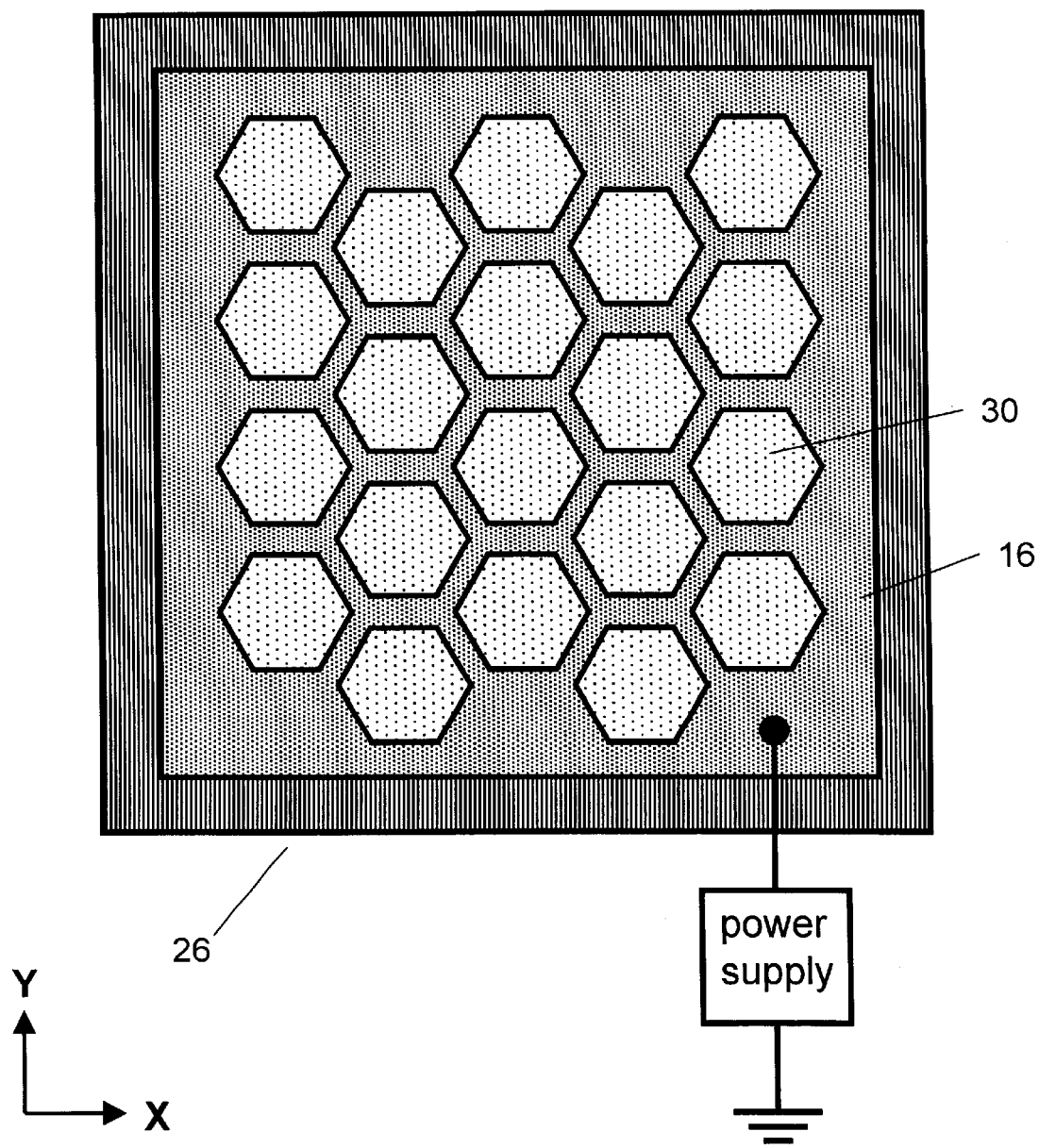
FIG. 8 illustrates a schematic top view of a fourth example of a system for actively controlling the shape of a sheet, according to the present invention.

FIG. 8 illustrates a schematic top view of a fourth example of a system for actively controlling the shape of a sheet, according to the present invention. In this view, electrodes 14 have been removed for purposes of clarity. Hexagonal-shaped patches 30 of electroactive material are arranged in a hexagonal close packed (HCP) array across the surface of, and attached to, conductive substrate 16, which is attached to structure 26. Power supply 18 is electrically attached to conductive substrate 16.

Figure 9:
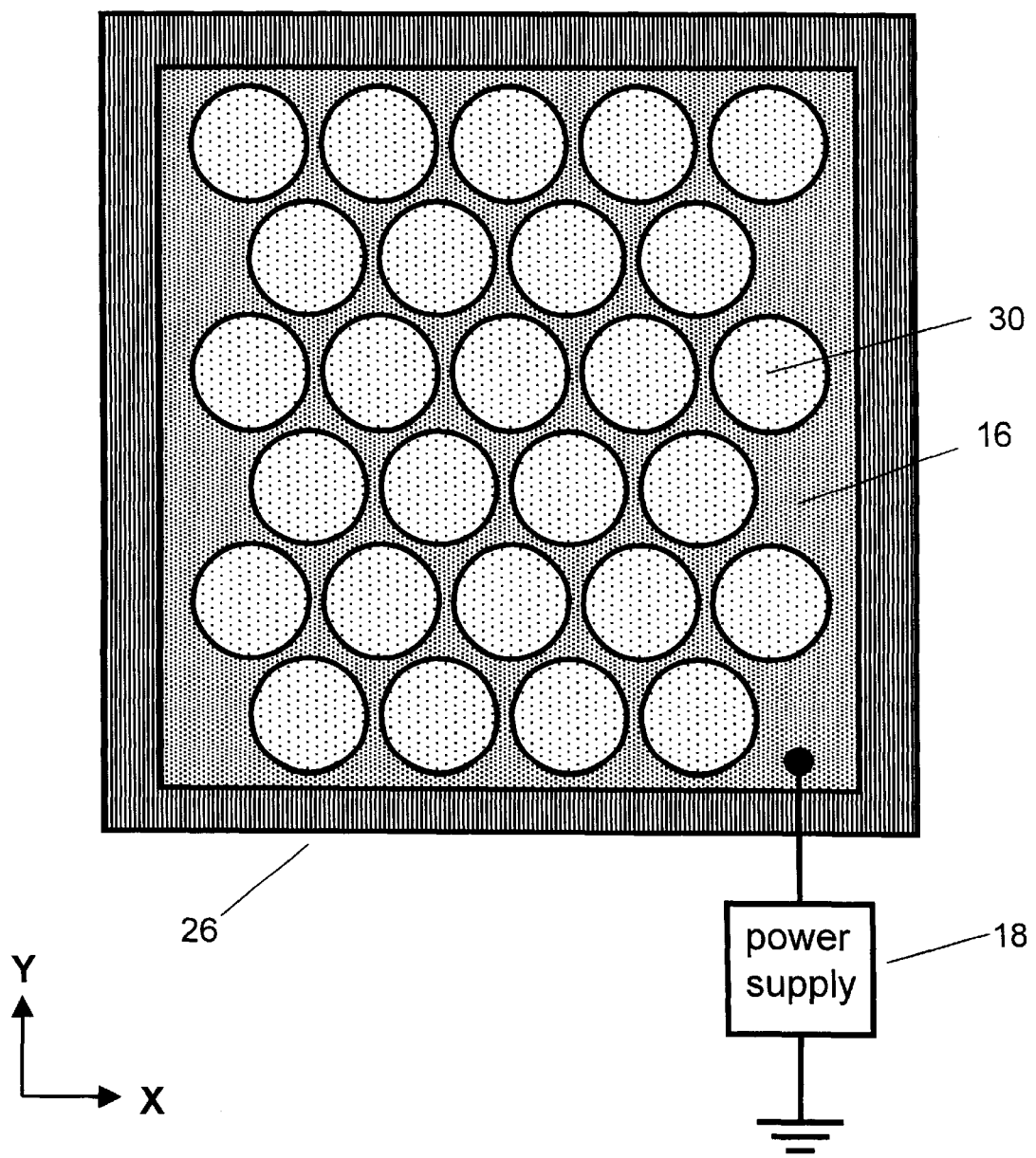
FIG. 9 illustrates a schematic top view of a fifth example of a system for actively controlling the shape of a sheet, according to the present invention.

FIG. 9 illustrates a schematic top view of a fifth example of a system for actively controlling the shape of a sheet, according to the present invention. In this view, multiple electrodes 14 have been removed for purposes of clarity. Circularly-shaped patches 30 of piezoelectric material are arranged in a hexagonal close packed (HCP) array across the surface of, and attached to, conductive substrate 16, which is attached to structure 26. Power supply 18 is electrically attached to conductive substrate 16.

Figure 10:
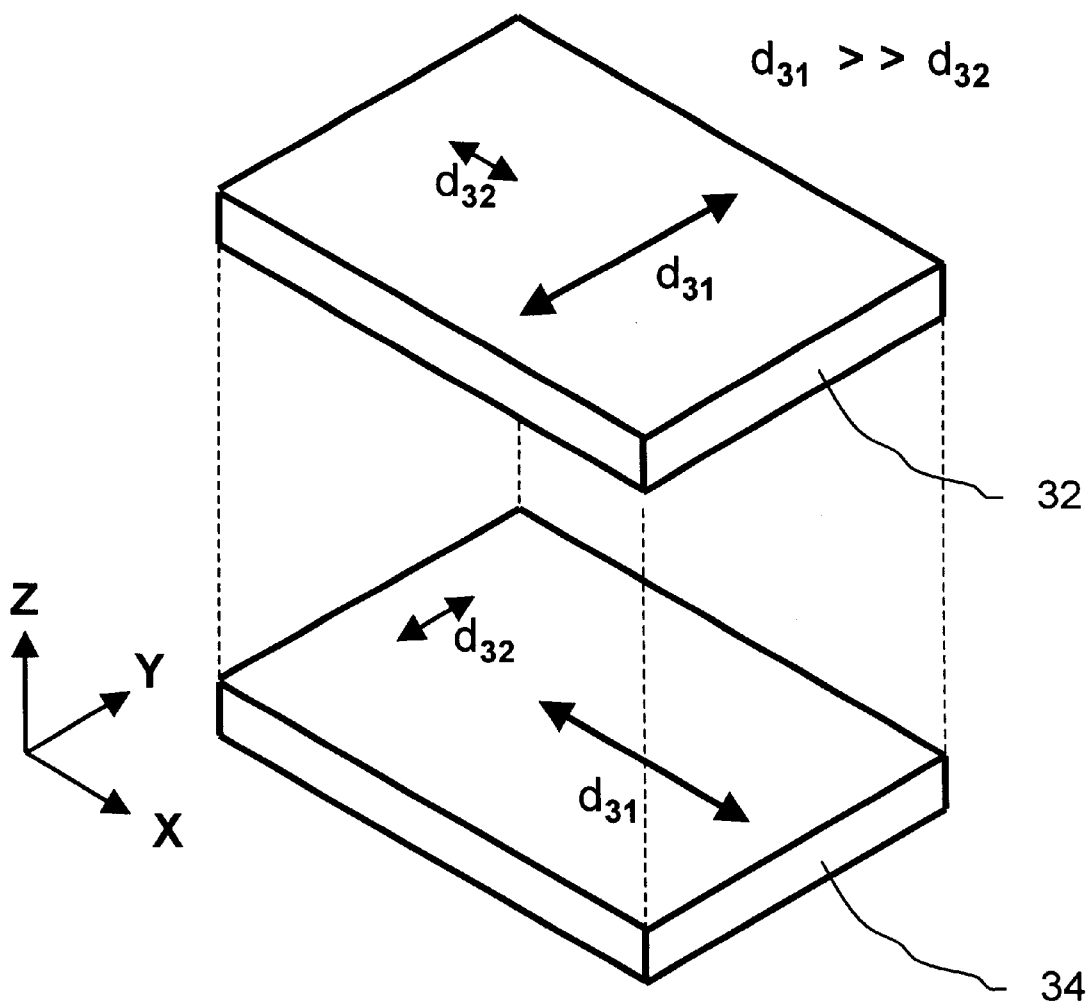
FIG. 10 illustrates a schematic isometric view of a cross-ply 0/90 BIMORPH geometry, according to the present invention.

FIG. 10 illustrates a schematic isometric view of a cross-ply 0/90 BIMORPH geometry, according to the present invention. In this geometry, two layers of piezoelectric material 32 and 34, such as PVDF, are laminated together to form a cross-ply 0/90 BIMORPH type structure. Unlike conventional piezoelectric ceramics (e.g. PZT), polymer films made of polyvinylidene fluoride (PVDF) can be manufactured having preferentially biased piezoelectric properties by mechanically straining the material along a principal axis during poling (e.g. polarization). For example, in top layer 32, the principal axis coincides with the Y-axis. This means that the piezoelectric expansion coefficient $d_{31}$ is much larger along the Y-axis than $d_{32}$, which is the piezoelectric expansion coefficient in the other orthogonal direction (e.g. along the X-axis). Conversely, for bottom layer 34, the principal axis of the greatest expansion $d_{31}$ is rotated 90 degrees from layer 32, and aligned with the X-axis. Hence, the designation "0/90 Cross-Ply."

Figure 11:
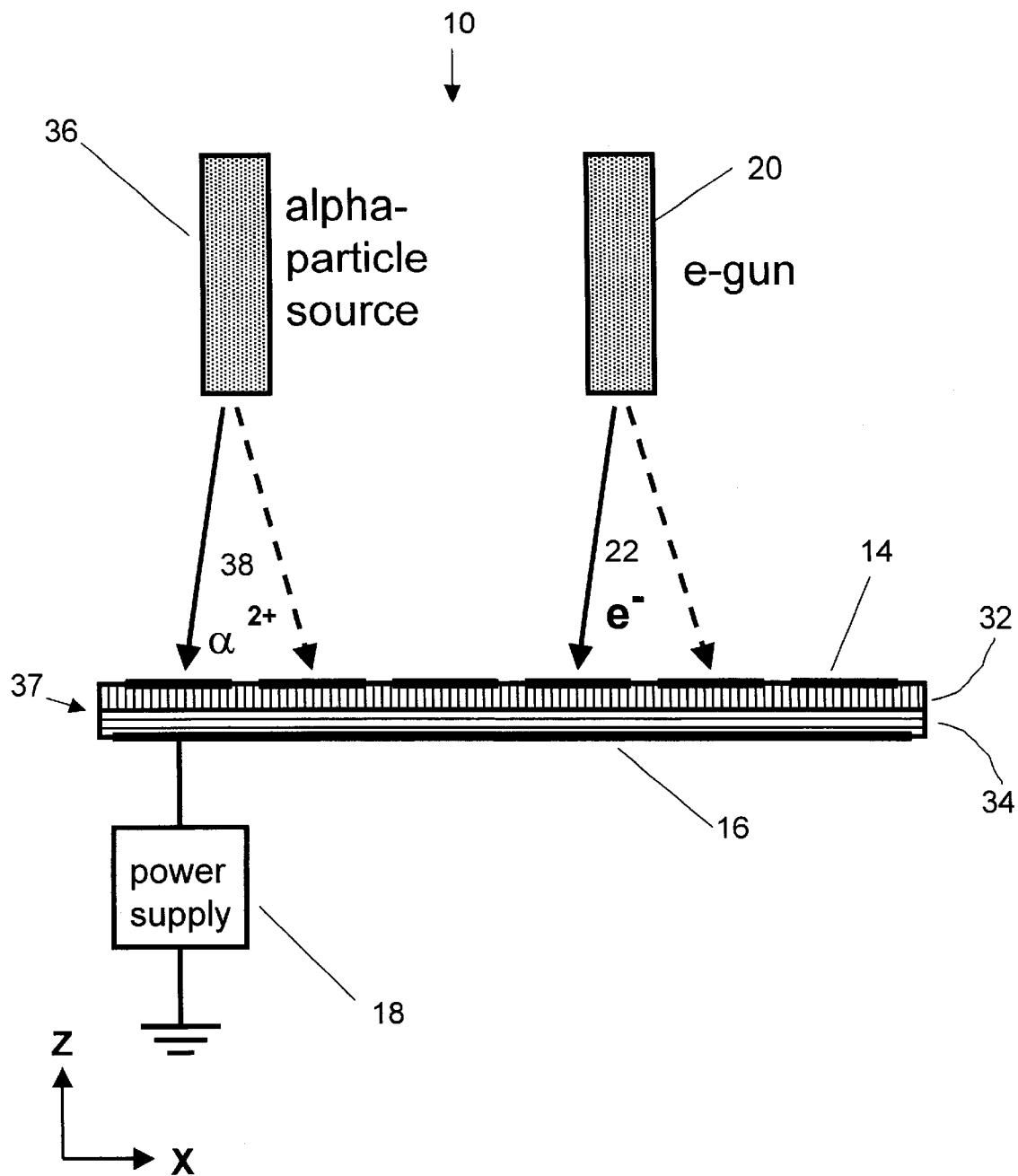
FIG. 11 illustrates a schematic cross-section side view of a sixth example of a system for actively controlling the shape of a sheet, according to the present invention.

FIG. 11 illustrates a schematic cross-section side view of a sixth example of a system for actively controlling the shape of a 0/90 Cross-Ply BIMORPH structure, according to the present invention. Preferentially biased PVDF layers 32 and 34 are laminated together with their principal axes arranged at 90 degrees to each other, as shown in FIG. 10, to form a 0/90 Cross-Ply BIMORPH composite structure 37. A plurality of electrodes 14 are disposed across the frontside of top layer 32. Conductive substrate 16 is attached to the backside of bottom layer 34, and power supply 18 is electrically attached to substrate 16. In this sixth example, application of surface charge to electrodes 14 by electron beam gun 20 via electrons 22 results in a single excitation voltage (e.g. transverse electric field) disposed across the composite laminate of top layer 32 bonded to bottom layer 34. However, curvature of the entire laminated structure 37 is different along the X-direction than along the Y-direction, according to the degree of preferential bias in the piezoelectric expansion coefficients $d_{31}$ and $d_{32}$, for each of the individual layers 32 and 34. So, instead of curving into a spherical shape, an ellipsoidal shape (e.g. egg-shape) would be produced with this arrangement.

FIGS. 10 and 11 illustrate an example of a cross-ply geometry where the two different layers are oriented perpendicular to each other, e.g. at 0 and 90 degrees in the X-Y plane. However, other angles of orientation (e.g. the skew angle) less than or greater than 90 degrees can also be used. Also, more than two layers of preferentially biased sheets can be used, each being oriented at a different angle than another layer. In this way, very complex composites can be built up by laminating multiple sheets with arbitrary orientations (e.g. skew angles) within the X-Y plane. The result of laminating, for example, preferentially biased PVDF films, with multiple layers having alternating skew angles less than or greater than 90 degrees, is the ability for the composite structure to exhibit twisting behavior in response to an applied transverse electric field. The present invention is intended to include cross-ply laminates any number of layers, and with skew angles less than or greater than 90 degrees, not just 0 and 90 degrees (except where the phrase 0/90 cross-ply is specifically used). The use of piezoelectric laminates with skewed cross-ply composition for torsional (e.g. twisting) control is described in U.S. Pat. No 4,868,447 to Lee and Moon, which is herein incorporated by reference.

Also illustrated in FIG. 11 is a second source 36 of charged particles; in this example, alpha particles, disposed so as to direct a beam of alpha particles 38 towards one or more selected electrodes 14. Source 36 can comprise an ion beam generator, or a source of a radioactive isotope, such as Polonium 210, which decays by releasing an energetic alpha particle with a high energy (e.g. 5–8 MeV). Alpha particles carry a 2+ charge, and can travel long distances in a vacuum. Because they carry a 2+ charge, alpha particles can be deflected, aimed, and focussed by electrostatic or magnetic means, including deflector plates and magnetic coils. Alpha particles are stopped in a thin layer on the surface. Optional use of a second source of charged particles can provide additional possibilities for control of electric charge in selected electrodes. An added benefit of using positively charged alpha particles is the capability to directly neutralize, erase, reduce, or remove the buildup of excess or unwanted negative charge resulting from electron deposition by e-gun 20.

One purpose of constructing such a 0/90 Cross-Ply BIMORPH structure is to allow for independent control of the surface curvature in two independent, orthogonal directions. This allows a complicated final surface profile, such as a paraboloid, to be achieved based on correcting a completely random (e.g. uncorrelated) initially deformed surface shape. Such a complicated surface profile can not be generally achieved from correction of random curvature errors when using standard "isotropic" BIMORPH-type bending structures (e.g. $d_{31}=d_{21}$), which creates identical curvatures in both the X and Y directions induced by a single voltage excitation across the isotropic layers. However, to provide complete control of the final, corrected shape, independent control of curvature in two orthogonal directions for a 0/90 Cross-Ply BIMORPH structure requires independent voltage excitation levels of the top and bottom layers, 32 and 34.

Figure 12:
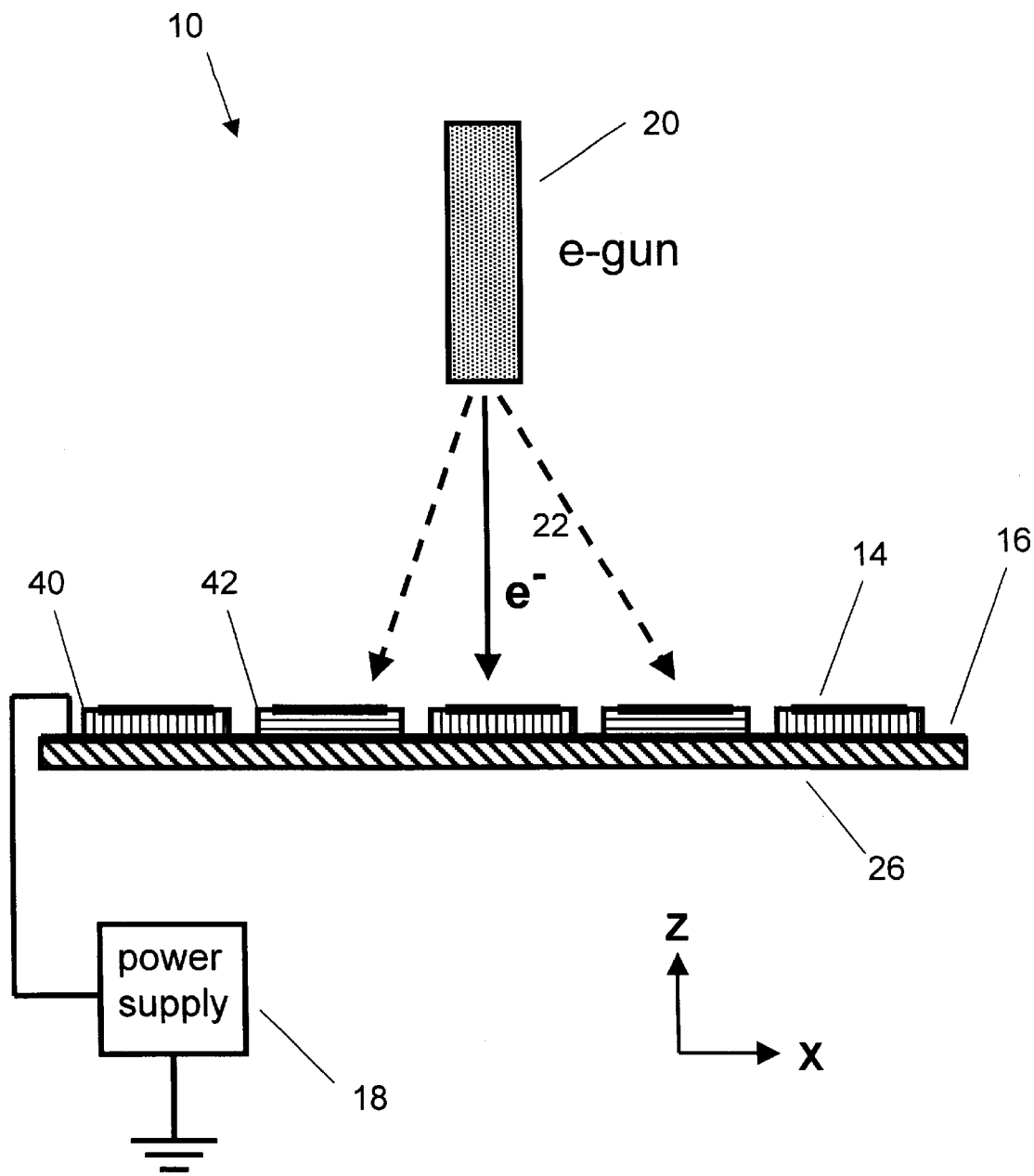
FIG. 12 illustrates a schematic cross-section side view of a seventh example of a system for actively controlling the shape of a 0/90 Cross-Ply BIMORPH structure, according to the present invention.

FIG. 12 illustrates a schematic cross-section side view of a seventh example of a system for actively controlling the shape of a 0/90 Cross-Ply BIMORPH structure, according to the present invention. Electrons 22 from electron beam gun 20 are addressed and deposited on at least one of a plurality of frontside electrodes 14. A plurality of patches of preferentially biased piezoelectric materials 40 and 42 are attached to a structure 26, with a conductive substrate disposed in-between patches 40, 42 and structure 26. Power supply 18 is electrically connected to conductive substrate 16. Each patch of piezoelectric material 40, 42 has an individual electrode 14 attached thereon to the frontside. Patches 40 have their principal axis of preferential bias aligned 90 degrees orthogonal to the principal axis of preferential bias for patches 42. Adjacent patches 40 and 42 can be arranged in a checkerboard pattern, or other regularly repeating pattern. By appropriate control of e-beam gun 20, electrons 22 can be selectively deposited on either patches 40 or 42, thereby providing individual excitation voltage to patches that can produce UNIMORPH-type curvature primarily in either the X principal axis or the Y principal axis, depending on the degree and orientation of the preferential bias.

Figure 13:
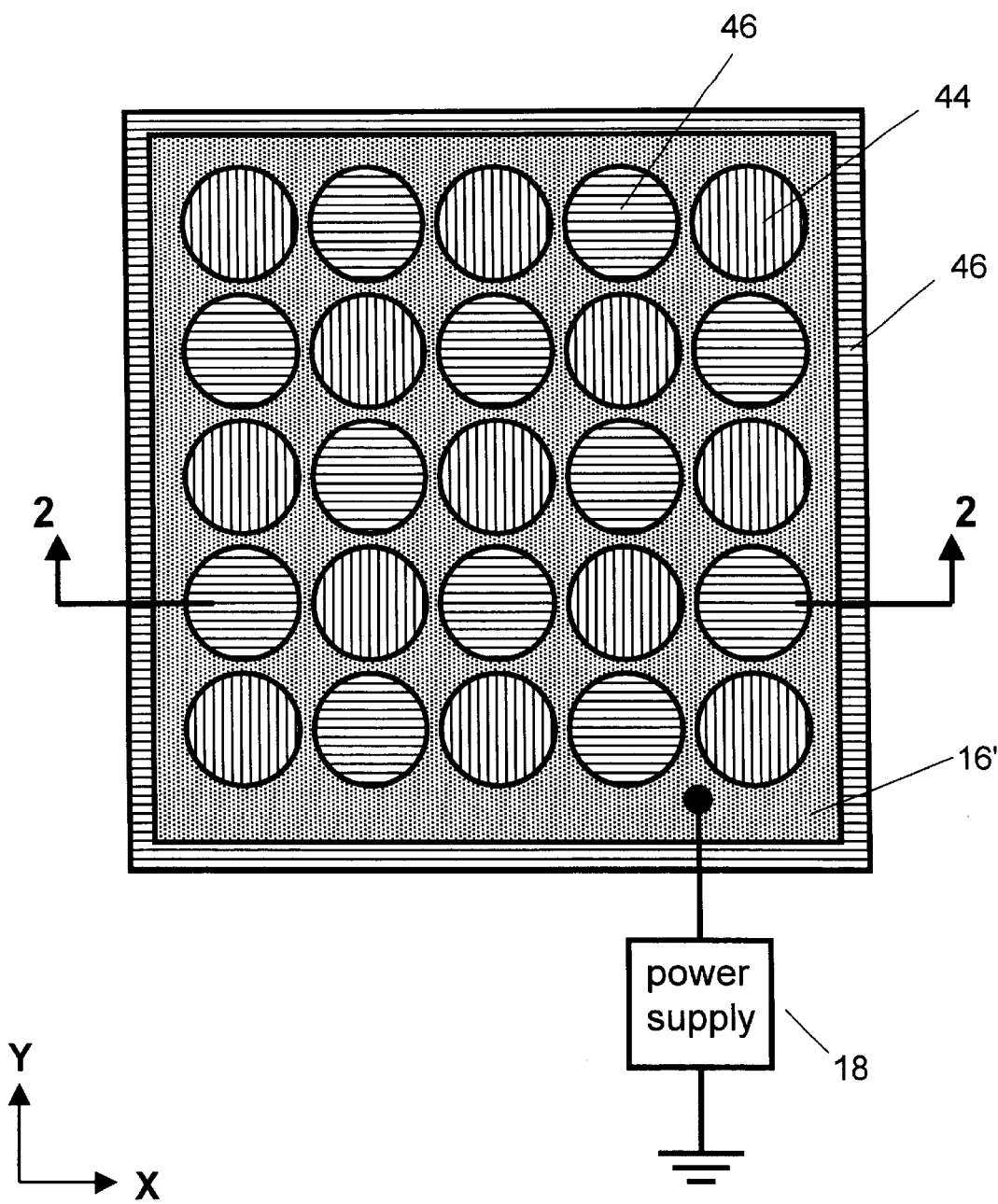
FIG. 13 illustrates a schematic top view of a eighth example of a system for actively controlling the shape of a 0/90 Cross-Ply BIMORPH structure, according to the present invention.
Figure 14:
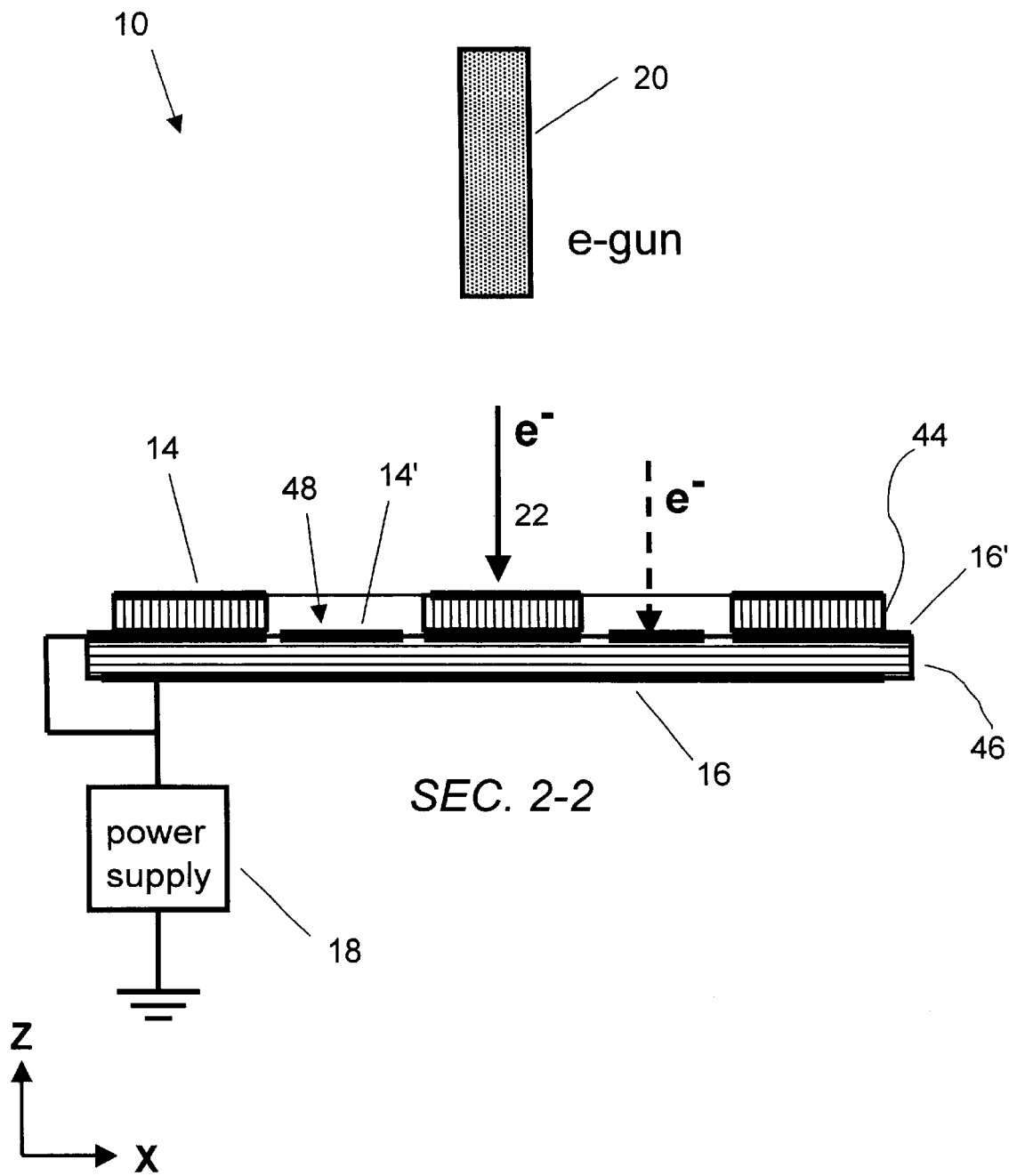
FIG. 14 illustrates a schematic cross-section view (SEC. 2—2) of the eighth example shown in FIG. 13, of a system for actively controlling the shape of a 0/90 Cross-Ply BIMORPH structure, according to the present invention.

FIG. 13 illustrates a schematic top view and FIG. 14 illustrates a schematic cross-section view (SEC. 2—2) of a eighth example of a system for actively controlling the shape of a 0/90 Cross-Ply BIMORPH structure, according to the present invention. A top layer 44 having first preferentially biased piezoelectric properties is bonded to a bottom layer 46 having second preferentially biased piezoelectric properties, wherein the principal direction of preferential bias for the top layer 44 is oriented 90 degrees orthogonal to the principal direction of preferential bias for the bottom layer 46. First conductive substrate 16 is attached to the backside of bottom layer 46, and second conductive substrate 16' is attached to the backside of top layer 44. Power supply 18 is electrically connected to both first and second conductive substrates 16 and 16'. Top layer 44 is perforated with a plurality of holes 48. Perforated holes 48 provide access to and expose the underlying bottom layer 46 to electrons 22 generated by e-gun 20. Electrodes 14 are attached to the frontside of top layer 44, as shown in FIG. 14 (but not shown in FIG. 13 for purposes of clarity). Bottom layer 46 can have electrodes 14' attached to the frontside of bottom layer 46, as shown in FIG. 14 (but omitted from FIG. 13 for purposed of clarity). Independent control of curvature in the two orthogonal directions (e.g. X-axis and Y-axis) can be achieved by independently exciting the top layer 44 by either irradiating the top layer electrode 14, or by exciting the bottom layer 46 by irradiation the bottom layer electrode 14' by shooting electrons 22 through perforations 48.

Figure 15:
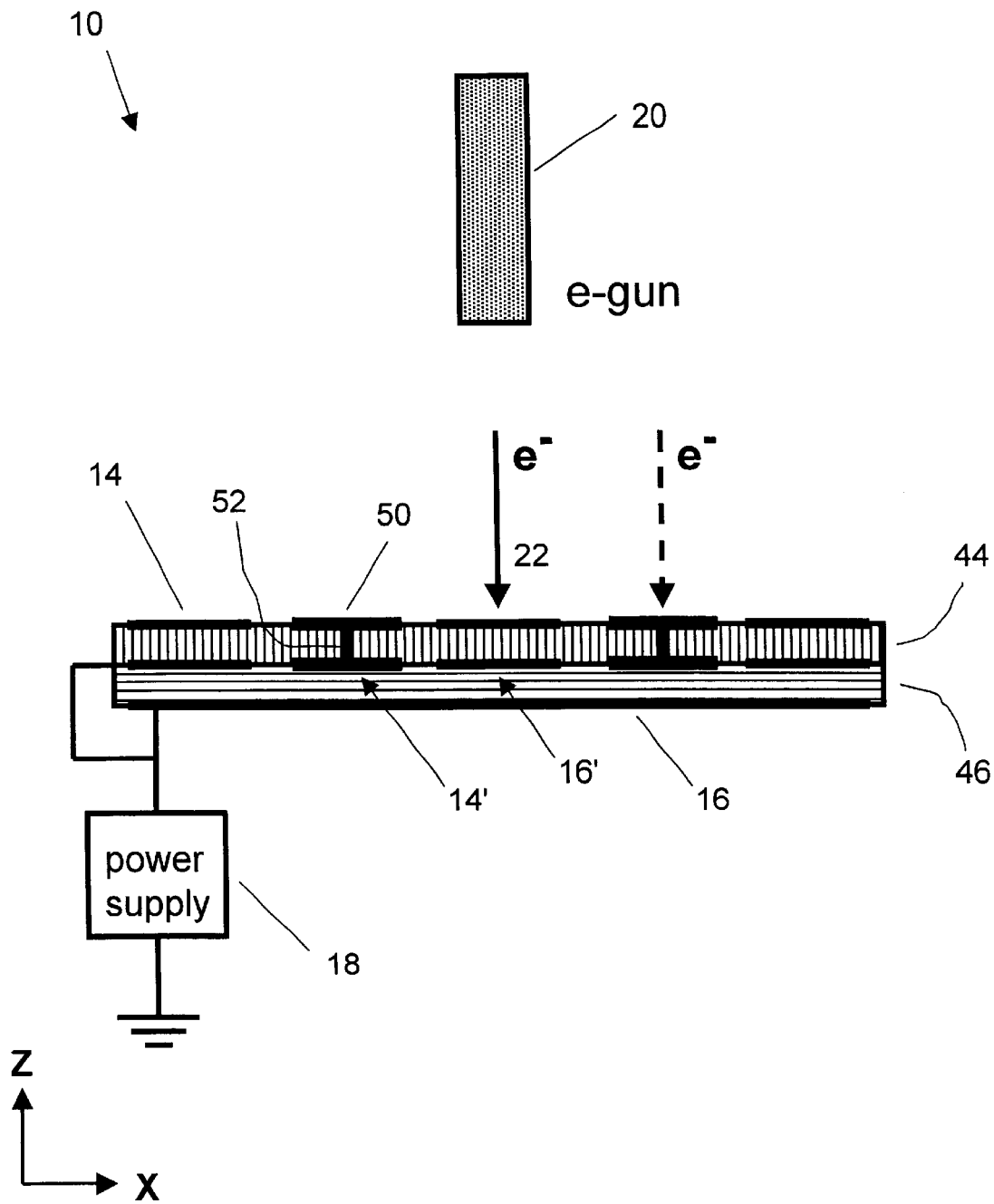
FIG. 15 illustrates a schematic cross-section side view of a ninth example of a system for actively controlling the shape of a 0/90 Cross-Ply BIMORPH structure, according to the present invention.

FIG. 15 illustrates a schematic cross-section side view of a ninth example of a system for actively controlling the shape of a 0/90 Cross-Ply BIMORPH structure, according to the present invention. Cross-Ply BIMORPH structure includes a top layer 44 having first preferentially biased piezoelectric properties that is bonded to a bottom layer 46 having second preferentially biased piezoelectric properties, wherein the principal direction of preferential bias for the top layer 44 is oriented 90 degrees orthogonal to the principal direction of preferential bias for the bottom layer 46. First conductive substrate 16 is attached to the backside of bottom layer 46, and second conductive substrate 16' is attached to the backside of top layer 44. Power supply 18 is electrically connected to both first and second conductive substrates 16 and 16'. Bottom layer 46 has a second set of electrodes 14' attached to the frontside of bottom layer 46. A third set of electrodes 50 is disposed on the frontside surface of top layer 44, alternating with the first set of electrodes 14. Electrodes 50 are disposed directly above corresponding electrodes 14', and are electrically connected together by vertical conductive vias 52. Conductive vias 52 can be manufactured by well-known process using low-temperature or high-temperature cofired ceramic technology developed by the semiconductor industry for high-density packaging of integrated circuit chips and their associated electrical leads. Conductive vias 52 provide an equipotential electrical pathway to conduct electric charge (e.g. electrons 22) that is deposited on frontside electrode 50 by e-gun 20 down to the buried (e.g. hidden) electrode 14' on the frontside of bottom layer 46.

Referring still to FIG. 15, both electrode 50 and connected electrode 14' have the same potential, therefore, no electric field exists across top layer 44, which prevents top layer 44 from expanding (or contracting) at that location. However, a potential difference is created across bottom layer 46 between the potential of electrode 14' and the controlled potential of conductive substrate 16. This arrangement provides for independent control of curvature in the two orthogonal directions (e.g. X-axis and Y-axis) by independently exciting the top layer 44 by either irradiating the top layer electrode 14, or by exciting the bottom layer 46 by irradiation the bottom layer electrode 14' by directing electrons 22 to second frontside electrode 50, which is electrically connected by via 52 to buried electrode 14'.

Figure 16:
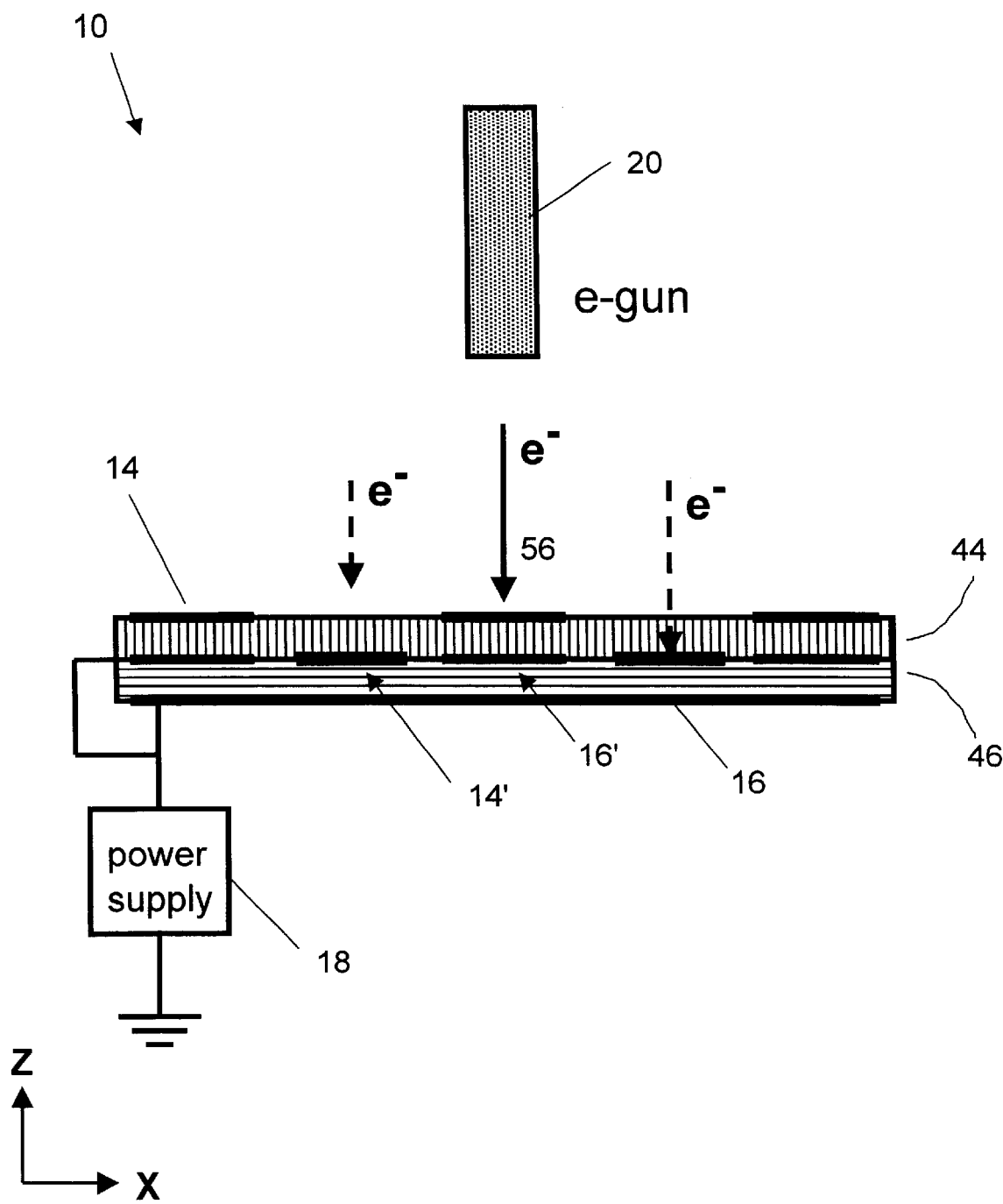
FIG. 16 illustrates a schematic cross-section side view of a tenth example of a system for actively controlling the shape of a 0/90 Cross-Ply BIMORPH structure, according to the present invention.

FIG. 16 illustrates a schematic cross-section side view of a tenth example of a system for actively controlling the shape of a 0/90 Cross-Ply BIMORPH structure, according to the present invention. FIG. 16 is identical to FIG. 15, except that electrode 50 and conductive via 52 are not present. In this tenth example, electrons 56 generated by e-gun 20 have a sufficiently high kinetic energy to penetrate directly through top layer 44 without stopping. However, their energy is sufficiently low energy to stop inside buried electrode 14'. Alternatively, high energy electrons 56 are stopped completely within frontside electrode 14. This result can be achieved by relying on the well-known effect that high atomic number (high-Z) metals (e.g. gold, silver, nickel) have a much greater stopping power for electrons than low atomic number (low-Z) ceramics (Oxygen, fluoride, etc.). Hence, electrons will penetrate much deeper into low-Z materials than high-Z metals. By not providing an electrode 50 of the type depicted in FIG. 15, this then provides an "open door" or "virtual window" for easy passage of high energy electrons through the clear space that exists in-between adjacent electrodes 14. This arrangement provides for independent control of curvature in the two orthogonal directions (e.g. X-axis and Y-axis) by independently exciting the top layer 44 by either irradiating the top layer high-Z electrode 14, or by exciting the bottom layer 46 by shooting high energy electrons 56 directly through top layer 44 without stopping, and then catching (e.g. stopping) these penetrating electrons in buried high-Z electrode 14'.

Figure 17:
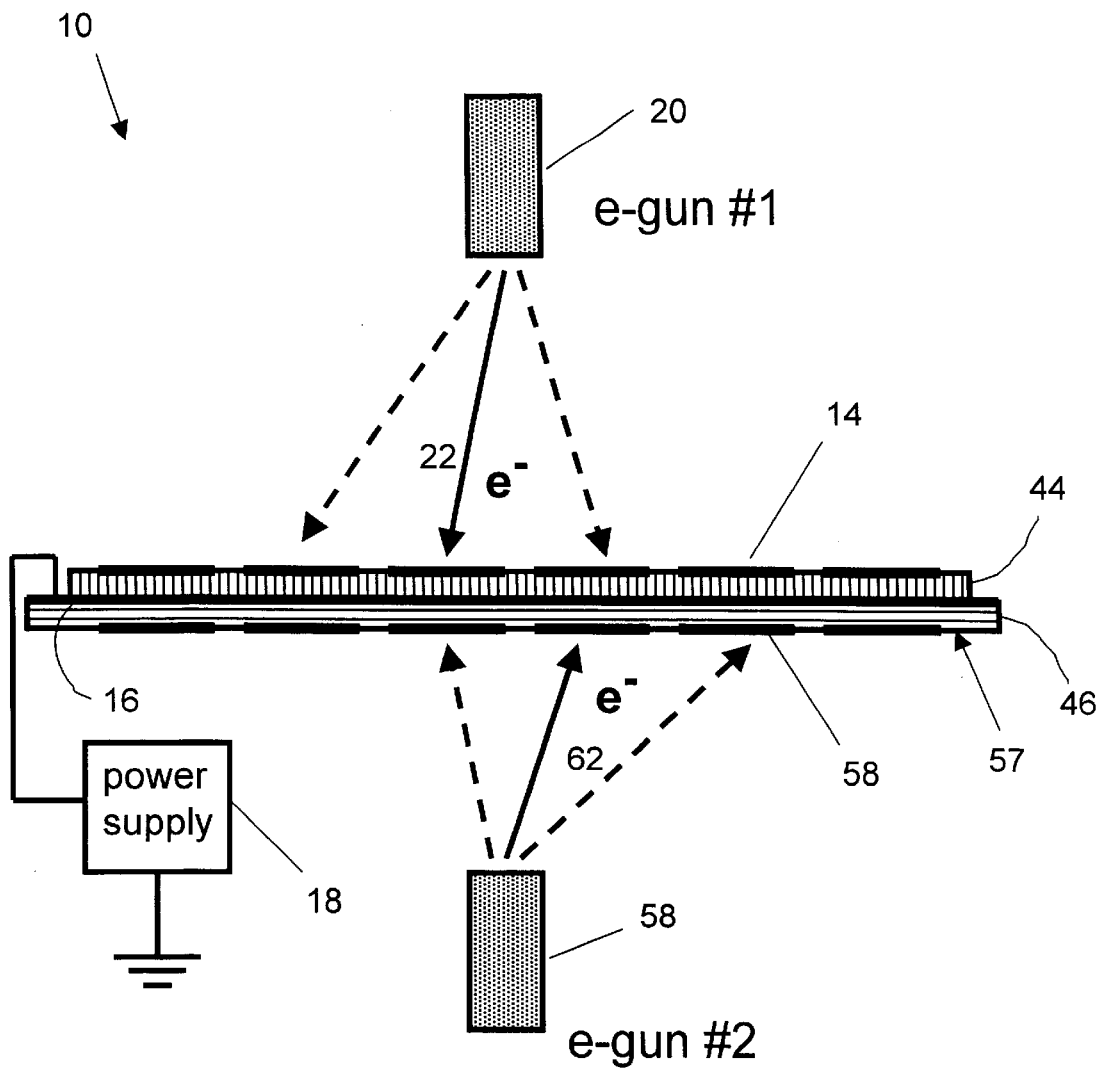
FIG. 17 illustrates a schematic cross-section side view of an eleventh example of a system for actively controlling the shape of a 0/90 Cross-Ply BIMORPH structure, according to the present invention.

FIG. 17 illustrates a schematic cross-section side view of an eleventh example of a system for actively controlling the shape of a 0/90 Cross-Ply BIMORPH structure, according to the present invention. Cross-Ply BIMORPH structure includes a top layer 44 having first preferentially biased piezoelectric properties that is bonded to a bottom layer 46 having second preferentially biased piezoelectric properties, wherein the principal direction of preferential bias for the top layer 44 is oriented 90 degrees orthogonal to the principal direction of preferential bias for the bottom layer 46. Conductive substrate 16 is attached in-between the backside of top layer 44, and the frontside of bottom layer 46. Power supply 18 is electrically connected to conductive substrate 16. Bottom layer 46 has a second set of electrodes 58 attached to the backside 57 of bottom layer 46. The location of backside electrodes 58 corresponds generally to the position of frontside electrodes 14. A second source of charged particles 60 (e.g. e-gun #2) is located on the backside of the cross-ply BIMORPH structure, and is disposed to aim and deposit charged particles on to selected backside electrodes 58. This arrangement provides for independent control of curvature in the two orthogonal directions (e.g. X-axis and Y-axis) by independently exciting the top layer 44 by using the first e-gun 20 to irradiate the top layer frontside electrode 14, and/or exciting the bottom layer 46 by using the second e-gun 60 to irradiate bottom layer backside electrode 58.

Method for Shape Control

A first example of a method for actively controlling the shape of a sheet of an electroactive material comprises the steps of: (a) providing a sheet of an electroactive material having a plurality of electrodes attached to the frontside of the sheet and having a conductive substrate attached to the backside of the sheet; (b) applying an electric potential to the conductive substrate; (c) generating, aiming, and depositing a beam of charged particles onto an electrode; and (d) creating an electric field across the sheet of electroactive material due to the accumulation of electric charge within the electrode, whereby the sheet of electroactive materials changes it shape in response to the applied transverse electric field. The electroactive material can comprises a piezoelectric material. The charged particles can be electrons. The method can further comprise generating, aiming, and depositing a beam of positively charged alpha particles onto an electrode, thereby decreasing or neutralizing any buildup of negative electric charges.

A Second example of a method for actively controlling the shape of a sheet of an electroactive material comprises:

a) providing a sheet of electroactive material comprising a plurality of electrodes attached to the frontside of the sheet and a conductive substrate attached to the backside of the sheet;

b) identifying a desired shape of the sheet;

c) applying an electric potential to the conductive substrate;

d) identifying a selected electrode;

e) generating, aiming, and depositing a beam of charged particles onto the selected electrode;

f) locally bending the sheet at the location of the selected electrode, in response to the deposition of electrons in step d); and g) repeating steps c) through f) for as many locations as is necessary to achieve the overall desired shape of the sheet.

After the first selected electrode has been irradiated with charged particles (e.g. electrons), the next (e.g. second) electrode is selected, which can be located anywhere on the sheet. Prior to, or during, the exposure of the second electrode, an electric potential is applied to the conductive substrate. The magnitude of this second electric potential (e.g. second voltage) can be the same, or different, than the first electric potential associated with the first selected electrode. By having the ability to adjust the electric potential independently for each selected electrode that is currently being irradiated, this provides the capability to individually control the potential drop (e.g. difference) across the sheet underneath the selected electrode, and, hence, the transverse electric field. In this way, local changes in the shape of the sheet can be easily controlled.

Continuing the explanation of this method of operation, conductive substrate 16 is disposed across the entire backside of sheet 12, providing a common plane of electric potential that is common to all of the addressed locations represented by each individual frontside electrode. Consequently, in the case where the backside electrode potential (e.g. voltage applied to conductive substrate 16) is changed when a new electrode is addressed by the electron beam 22, it is clear that the backside potential also changes by the same amount underneath the previously irradiated electrode (since both electrodes have a common backside potential). Fortunately, at the location of the previous electrode, since there is no electron beam irradiating that previous electrode, no electric circuit can be completed, and, hence, no change in the local shape of the sheet occurs, despite the change in the underlying backside potential. This characteristic is supported by experimental results, and is critical to the efficient operation of this shape control method.

A simple analogy can be provided for this method of operation and shape control. Changing the position of the electron beam from electrode to electrode across the surface is like disconnecting the lead wire from one frontside electrode and reconnecting it to another. The electric circuit is closed in either case, by the connected lead wire, or by the flux of electrons (or other charged particles) during beam irradiation. The advantage is that a single electron beam replaces the entire array of lead wires attached to the array of frontside electrodes.

Experimental results (see Main, et al., "Maintenance of Inflated Structure Shape Using Electron Gun Controlled Piezoelectric Materials", AIAA report No. AIAA-98-1982, 1998, pp. 2294–2301, which is herein incorporated by reference) demonstrate a number of important results. First, application of a backside electrode voltage (e.g. from 0 to +200 V) creates no piezoelectric strain when the electron beam is turned off. Second, application of the e-beam combined with backside voltage control (e.g. at 100 V) results in measurable piezoelectric strain that saturates after 1–2 seconds. Third, when the e-beam is subsequently turned off, and backside voltage zeroed, the induced strain persists for many 100's of seconds.

These results indicate that the e-beam needs to dwell on each addressed (e.g. selected) electrode for only a short period of time, e.g. 1–2 seconds, sufficient to induce the desired strain, before moving on to the next electrode in sequence. The first and third results, combined, indicate that when the backside electrode potential is changed, the induced strain in all of the electrodes not being irradiated by the e-beam will not be affected by changes in the backside potential (only the currently irradiated electrode will induce strain changes in the sheet when the backside potential is changed).

A third example of a method for actively controlling the shape of a sheet of an electroactive material in two independent, orthogonal directions, comprises:
 a) providing a sheet comprising a lamination of two preferentially biased electroactive layers, with the preferential bias of the top layer being arranged perpendicular to the preferential bias of the bottom layer, and further wherein the top layer comprises a plurality of top electrodes and further comprising a conductive substrate attached to the backside of the sheet;
 b) identifying a desired shape of the sheet;
 c) identifying a selected top electrode;
 d) applying an electric potential to the conductive substrate;
 e) generating, aiming, and depositing a beam of charged particles onto the selected top electrode,
 f) creating a top layer excitation voltage on the selected top electrode;
 g) bending the sheet locally in the direction of the preferential bias of the top layer, in response to the top layer excitation voltage;
 h) applying an bottom layer excitation voltage to the bottom layer;
 i) bending the sheet locally in the direction of the preferential bias of the bottom layer, in response to the bottom layer excitation voltage; and
 j) repeating steps c) through i) for as many locations as is necessary to achieve the overall desired shape of the sheet.

A fourth example of a method of calibrating the shape response of a sheet of piezoelectric material, such as a BIMORPH structure, comprises: applying a voltage to a selected electrode; measuring the deformation of the sheet at the location of the selected electrode; repeating these two steps for all of the electrodes; and assembling a global sensitivity matrix from the measured deformations, which relates the deformed shape of the sheet to the set of voltages applied to the electrodes.

Experimental Results

A number of laboratory experiments were performed at the University of Kentucky that demonstrated the capability to change the shape of a piezoelectric sheet by using an electron beam to apply a flux of electrons to the frontside of a BIMORPH sheet, while adjusting the potential of a backside electrode with a power supply.

In the first experiment, a thick plate of PZT-5H, 7.6 cm×5 cm×1.9 mm thick, was clamped on one edge, and irradiated with low energy electrons over a 2.5 cm diameter beam spot. A silver electrode on the backside was connected to a power supply capable of supplying +/−250 V. A thin-foil strain gauge was attached to the silver electrode directly behind the 2.5 cm diameter beam spot. The e-beam flux was started, and then the power supply adjusted the backside electrode potential repeatedly in-between −200 V and +200 V over a period of about 200 seconds. With electron energies of 300 eV or 400 eV, essentially linear response was observed between the mechanical strain measured by the strain gauge, and the applied backside voltage. Some hysteresis was present upon reversal. The strain persisted for over 100 seconds after removal of the electron flux and after the power supply was zeroed.

For lower energy electrons, e.g. 250 eV, linear response was observed only as long as the backside potential was greater than about −20 V. Below −20 V, some nonlinear strain response was observed, which may be caused by instabilities in the dynamic equilibrium of the frontside charge potential due to secondary electron emission effects. Reducing the backside potential below −175 V did not change the induced strain because the negative surface potential was strong enough to effectively repel and choke off the incoming beam of 250 eV electrons. Controlled removal of induced strain could only be achieved by slowly ramping down the backside potential to zero simultaneously with application of the electron flux.

A second series of experiments were performed using the same electron beam gun as before, but this time using a BIMORPH mirror structure composed of two sheets of PVDF, 30 cm×20 cm×0.05 mm thick, glued together with epoxy to form a BIMORPH sheet with opposite poling. A nickel-copper electrode attached to the backside was connected to the power supply for backside potential control. The glued laminate was trimmed to 10 cm×5 cm and had an average thickness of 140 microns. The BIMORPH sheet was clamped on one edge, and deflections were measured using a non-contact laser triangulation system. Experiments were performed using the e-beam gun to "flood" the entire surface of the BIMORPH sheet by scanning a 0.5 mm beam spot rapidly across the entire surface with a beam current of 8 microamps. During e-beam irradiation with electrons ranging from 400 eV to 1000 eV, the backside electrical potential was varied from −200 V to +200 V, and the deflection of the sheet was measured.

Figure 18:
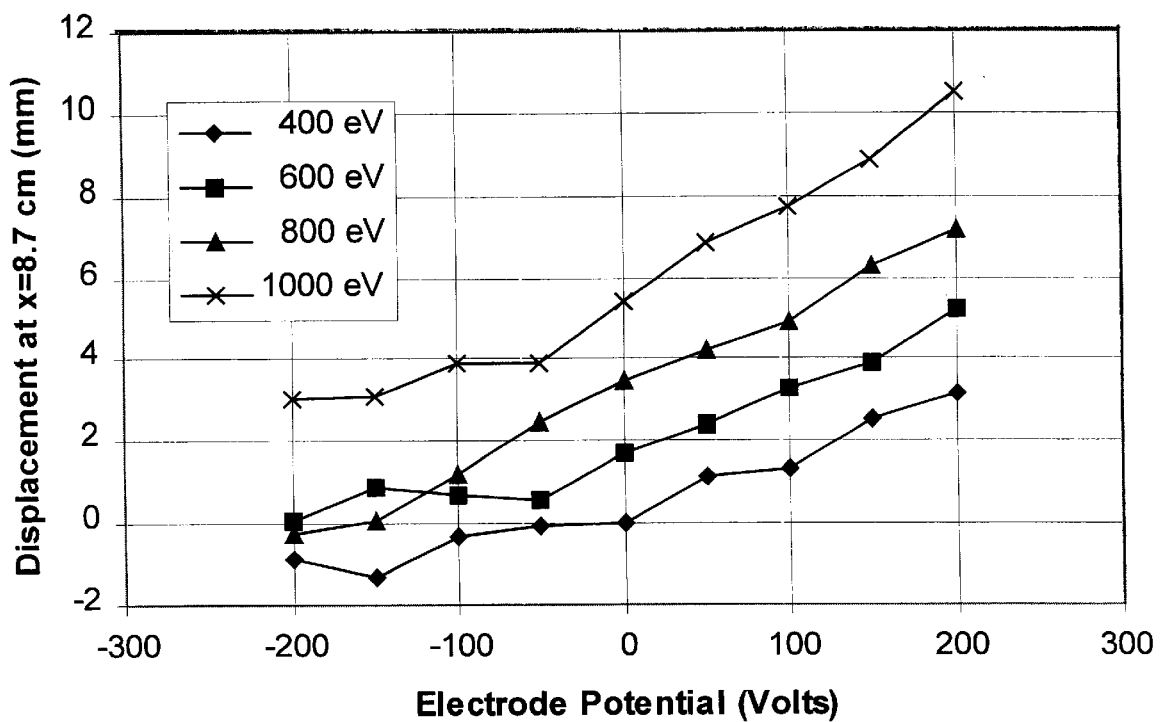
FIG. 18 shows experimental results performed at the University of Kentucky plotting the deflection of a BIMORPH sheet as a function of applied electrode voltage, for various electron energies, according to the present invention.

FIG. 18 shows experimental results performed at the University of Kentucky plotting the deflection of a BIMORPH sheet as a function of applied electrode voltage, for various electron energies, according to the present invention.

Two general classes of responses were observed in these tests. In the first class, for lower energy electrons (e.g. 400–600 eV), a two-part response was observed. Deflections generally increased linearly with increasing voltage from 0 to +200 V. However, for voltage changes in the range of 0 down to −200 V, a greatly reduced deflection response was observed. The lack of response at low electrode potentials (e.g. −200 V to 0 V), may be due to slowing down of the low energy electrons due to a negative surface potential to an energy sufficiently low to prevent stimulation of secondary electron emission.

In the second general class, with higher energy electrons (e.g. 800–1000 eV), a well-defined linear response was observed between the measured deflection and the applied backside electrode voltage. The most linear response was observed at an electron energy of 800 eV. It is likely that the regime in which secondary electrons are emitted (e.g. that correlates best with the observed linear response behavior) corresponds to the stable regime located in-between $E_I$ and $E_{II}$, namely, where the secondary electron emission yield is always greater than 1.

The estimated value of the frontside electric potential was calculated by using the measured deflection of the sheet and the applied backside potential with a linear elastic deflection formula that was derived for the sheet. Over the range of backside voltage from −200 V to +200 V, the frontside voltage was estimated to range from 200 V to +500 V, in a linear fashion.

A third experiment was performed to assess the stability of the deposited charge and deflected shape in vacuum. A flood of 1000 eV electrons, and an electrode potential of +200 V were applied to the sheet to stimulate curvature. The electron beam was then turned off, and the electrode potential was zeroed. The induced curvature persisted for approximately 5 minutes (in vacuum) before decaying.

Experiments are currently underway at Sandia National Laboratories using a nickel-copper electrode attached to the frontside of a PVDF BIMORPH sheet. This arrangement allows the frontside potential to be measured directly. The measured potential can also be compared to the estimated potential calculated with the elastic bending formula. Initial results indicate that the most linear deflection response is produced when using an electron energy of 1000 eV, due to difference in the secondary electron yield for nickel-copper, versus bare PVDF.

The particular sizes and equipment discussed above are cited merely to illustrate a particular embodiment of this invention. It is contemplated that the use of the invention may involve components or methods having different characteristics. For example, the frontside electrodes may be coated with a material, such as magnesium oxide, that has enhanced secondary electron emission yield characteristics.

It is intended that the scope of the invention be defined by the claims appended hereto.

What is claimed is:

1. A system for actively controlling the shape of a sheet, comprising:
    an electrode attached to the frontside of a sheet of an electroactive material;
    a charged particle generator, disposed so as to direct a beam of charged particles onto the electrode;
    a conductive substrate attached to the backside of the sheet; and
    a power supply electrically connected to the conductive substrate.
2. The system of claim 1, wherein the electroactive material comprises a piezoelectric material.
3. The system of claim 2, wherein the piezoelectric material comprises polyvinylidene fluoride.
4. The system of claim 1, wherein the charged particle generator comprises an electron beam gun, and further wherein said charged particles comprise electrons.
5. The system of claim 1, wherein the backside of the sheet comprises a reflective surface.
6. The system of claim 2, wherein the piezoelectric material comprises two piezoelectric layers arranged in a BIMORPH geometry.
7. The system of claim 6, wherein the BIMORPH geometry further comprises a 0/90 cross-ply geometry, comprising:
    a top layer having piezoelectric properties preferentially biased along a first principal axis;
    an electrode attached to the frontside of the top layer: and
    a bottom layer, attached to the top layer, having piezoelectric properties preferentially biased along a second principal axis;
    wherein the first principal axis is substantially perpendicular to the second principal axis.
8. The system of claim 7, wherein the layer having preferentially biased piezoelectric properties comprises a film of preferentially biased polyvinylidene.
9. The system of claim 7, wherein the top layer is perforated.
10. The system of claim 7, further comprising a second electrode disposed on the frontside of the bottom layer.
11. The system of 10, further comprising:
    a third electrode disposed on the frontside of the top layer, and located above the second electrode; and a conductive via that penetrates through the top layer; and electrically connects the second electrode to the third electrode.

12. The system of claim 1, wherein the diameter of the beam of charged particles is less than 50% of the lateral dimensions of the electrode.

13. The system of claim 12, wherein the structure comprises a reflective surface.

14. The system of claim 1, further comprising a structure attached to the sheet of electroactive material.

15. The system of claim 1, further comprising a coating deposited on the exterior surface of the electrode, said coating having enhanced secondary electron emission properties.

16. The system of claim 1, further comprising an alpha particle generator, disposed so as to direct a beam of alpha particles onto the electrode.

17. The system of claim 1, wherein the electrode has a shape selected from the group consisting of a circle, a square, a rectangle, a hexagon, and a polygon.

18. The system of claim 1, further comprising a plurality of electrodes arranged in a close-packed array on the frontside of the sheet of electroactive material, with a gap in-between each electrode.

19. The system of claim 1, further comprising a second charged particle generator, disposed for directing a second beam of charged particles towards the backside of the sheet.

20. A system for actively controlling the shape of a structure, comprising:
    a plurality of patches of an electroactive material attached to the frontside of the structure;
    an electrode attached to the frontside of each patch of electroactive material;
    a charged particle generator, disposed so as to direct a beam of charged particles onto at least one electrode;
    a conductive substrate disposed between the structure and the patches; and
    a power supply electrically connected to the conductive substrate.

21. The system of claim 20, wherein the plurality of patches comprise a preferentially biased piezoelectric material, wherein each patch is alternately aligned with its direction of preferred bias oriented perpendicular to adjacent patches, arranged in a checkerboard pattern.

22. A method for changing the shape of a sheet of an electroactive material, comprising:
    a) providing a sheet of electroactive material having an electrode attached to the frontside of the sheet and having a conductive substrate attached to the backside of the sheet;
    b) applying an electric potential to the conductive substrate;
    c) generating, aiming, and depositing a beam of charged particles onto the frontside electrode; and
    d) creating an electric field across the sheet of electroactive material due to the accumulation of electric charge within the frontside electrode.

23. The method of claim 22, further comprising, after step d);
    e) turning off the beam of charged particles; and
    f) zeroing the electric potential applied to the conductive substrate.

24. The method of claim 23, wherein the induced shape changes persist without decay in vacuum for up to 5 minutes.

25. The method of claim 23, further comprising a method for removing the changes in shape of the sheet induced by the steps of claim 23, the removal method comprising:
    a) generating, aiming, and depositing a beam of charged particles onto the frontside electrode;
    b) reapplying the same electric potential to the conductive substrate as was applied in step b) of claim 22; and
    c) ramping down to zero the electric potential previously applied in step b) of this claim.

26. The method of claim 22, wherein the magnitude of the shape change of the sheet is approximately linearly proportional to the magnitude of the electric potential applied to the conductive substrate in step b).

27. The method of claim 22, wherein the electroactive material comprises a piezoelectric material.

28. The method of claim 27, wherein the piezoelectric material comprises polyvinylidene, and further wherein the charged particles comprise electrons with an optimum energy of about 700 eV to 900 eV.

29. The method of claim 22, whereby the charged particles comprise electrons.

30. The method of claim 22, further comprising generating, aiming, and depositing a beam of alpha particles onto the electrode.

31. The method of claim 22, wherein in step c) the period of time during which the charged particles are being deposited is less than 3 seconds.

32. A method for actively controlling the shape of a sheet of electroactive material, comprising:
    a) providing a sheet of electroactive material comprising a plurality of electrodes attached to the frontside of the sheet and a conductive substrate attached to the backside of the sheet;
    b) identifying a desired shape of the sheet;
    c) applying an electric potential to the conductive substrate;
    d) identifying a selected electrode;
    e) generating, aiming, and depositing a beam of charged particles onto the selected electrode;
    f) locally bending the sheet at the location of the selected electrode, in response to the deposition of electric charge in step e); and
    g) repeating steps c) through f) for as many locations as is necessary to achieve the overall desired shape of the sheet.

33. The method of claim 32, wherein step b) of identifying a desired shape of the sheet comprises:
    a) measuring the initial, uncorrected shape of the sheet;
    b) calculating the difference between the desired shape and the initial, uncorrected shape from stop a); and
    c) selecting appropriate parameters for steps c) through g) in claim 26 so that the sheet deforms into the desired shape.

34. A method for actively controlling the shape of a sheet of electroactive material in two independent, orthogonal directions, comprising:
    a) providing a sheet comprising a lamination of two preferentially biased electroactive layers, with the preferential bias of the top layer being arranged perpendicular to the preferential bias of the bottom layer, and further wherein the top layer comprises a plurality of top electrodes and further comprising a conductive substrate attached to the backside of the sheet;
    b) identifying a desired shape of the sheet;

c) identifying a selected top electrode;

d) applying an electric potential to the conductive substrate;

e) generating, aiming, and depositing a beam of charged particles onto the selected top electrode, f) creating a top layer excitation voltage on the selected top electrode;

g) bending the sheet locally in the direction of the preferential bias of the top layer, in response to the top layer excitation voltage;

h) applying an bottom layer excitation voltage to the bottom layer;

i) bending the sheet locally in the direction of the preferential bias of the bottom layer, in response to the bottom layer excitation voltage; and j) repeating steps c) through i) for as many locations as is necessary to achieve the overall desired shape of the sheet.

35. A method of calibrating the response of the shape of a sheet of electroactive material having a plurality of electrodes attached to the frontside of the sheet, and having a conductive substrate attached to the backside of the sheet; the method comprising:

a) applying a first known voltage to a selected frontside electrode;

b) applying a first known voltage to the conductive substrate;

c) measuring the local transverse deformation of the sheet at the location of the selected frontside electrode;

d) repeating steps a) through c), sequentially, for each and every one of the frontside electrodes; and e) assembling a global sensitivity deflection matrix from the measured deformations, whereby the matrix relates the deformed shape of the sheet to the set of known voltages applied to the frontside electrodes.

* * * * *